(12) United States Patent
Ray et al.

(10) Patent No.: US 9,600,413 B2
(45) Date of Patent: Mar. 21, 2017

(54) COMMON PLATFORM FOR ONE-LEVEL MEMORY ARCHITECTURE AND TWO-LEVEL MEMORY ARCHITECTURE

(71) Applicants: Joydeep Ray, Folsom, CA (US);
Varghese George, Folsom, CA (US);
Inder M. Sodhi, Folsom, CA (US);
Jeffrey R. Wilcox, El Dorado Hills, CA (US)

(72) Inventors: Joydeep Ray, Folsom, CA (US);
Varghese George, Folsom, CA (US);
Inder M. Sodhi, Folsom, CA (US);
Jeffrey R. Wilcox, El Dorado Hills, CA (US)

(73) Assignee: Intel Corporation, Santa Clara, CA (US)

( * ) Notice: Subject to any disclaimer, the term of this patent is extended or adjusted under 35 U.S.C. 154(b) by 135 days.

(21) Appl. No.: 14/140,261

(22) Filed: Dec. 24, 2013

(65) Prior Publication Data
US 2015/0178204 A1 Jun. 25, 2015

(51) Int. Cl.
*G06F 12/00* (2006.01)
*G06F 12/06* (2006.01)
*G06F 12/02* (2006.01)
*G11C 5/04* (2006.01)

(52) U.S. Cl.
CPC ...... *G06F 12/0638* (2013.01); *G06F 12/0246* (2013.01); *G11C 5/04* (2013.01); *G06F 2212/7206* (2013.01)

(58) Field of Classification Search
None
See application file for complete search history.

(56) References Cited

U.S. PATENT DOCUMENTS

| 6,182,162 | B1 * | 1/2001 | Estakhri et al. | 710/11 |
| 8,607,023 | B1 * | 12/2013 | Kraipak et al. | 711/202 |
| 8,806,140 | B1 * | 8/2014 | Kraipak et al. | 711/137 |
| 2002/0083264 | A1 * | 6/2002 | Coulson | 711/112 |
| 2004/0225835 | A1 * | 11/2004 | Coulson | 711/114 |
| 2008/0005462 | A1 * | 1/2008 | Pyeon et al. | 711/113 |
| 2009/0249015 | A1 * | 10/2009 | Tzeng | 711/165 |
| 2011/0252178 | A1 * | 10/2011 | Wang | G06F 3/0607 710/316 |

(Continued)

*Primary Examiner* — Midys Rojas
*Assistant Examiner* — Stephanie Wu
(74) *Attorney, Agent, or Firm* — Lowenstein Sandler LLP

(57) ABSTRACT

Technologies for one-level memory (1LM) and two-level memory (2LM) configurations in a common platform are described. A processor includes a first memory interface coupled to a first memory device that is located off-package of the processor and a second memory interface coupled to a second memory device that is located off-package of the processor. The processor also includes a multi-level memory controller (MLMC) coupled to the first memory interface and the second memory interface. The MLMC includes a first configuration and a second configuration. The first memory device is a random access memory (RAM) of a one-level memory (1LM) architecture in the first configuration. The first memory device is a first-level RAM of a two-level memory (2LM) architecture in the second configuration and the second memory device is a second-level non-volatile memory (NVM) of the 2LM architecture in the second configuration.

25 Claims, 12 Drawing Sheets

(56) References Cited

U.S. PATENT DOCUMENTS

2014/0013036 A1* 1/2014 Kwon et al. .................. 711/103
2014/0192583 A1* 7/2014 Rajan et al. .................... 365/63
2014/0342609 A1* 11/2014 Sung et al. .............. 439/620.21

* cited by examiner

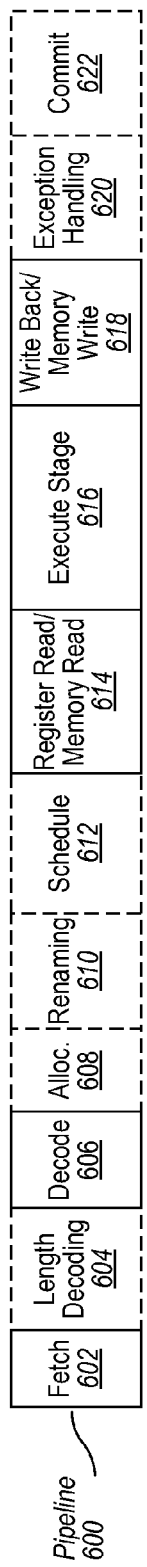
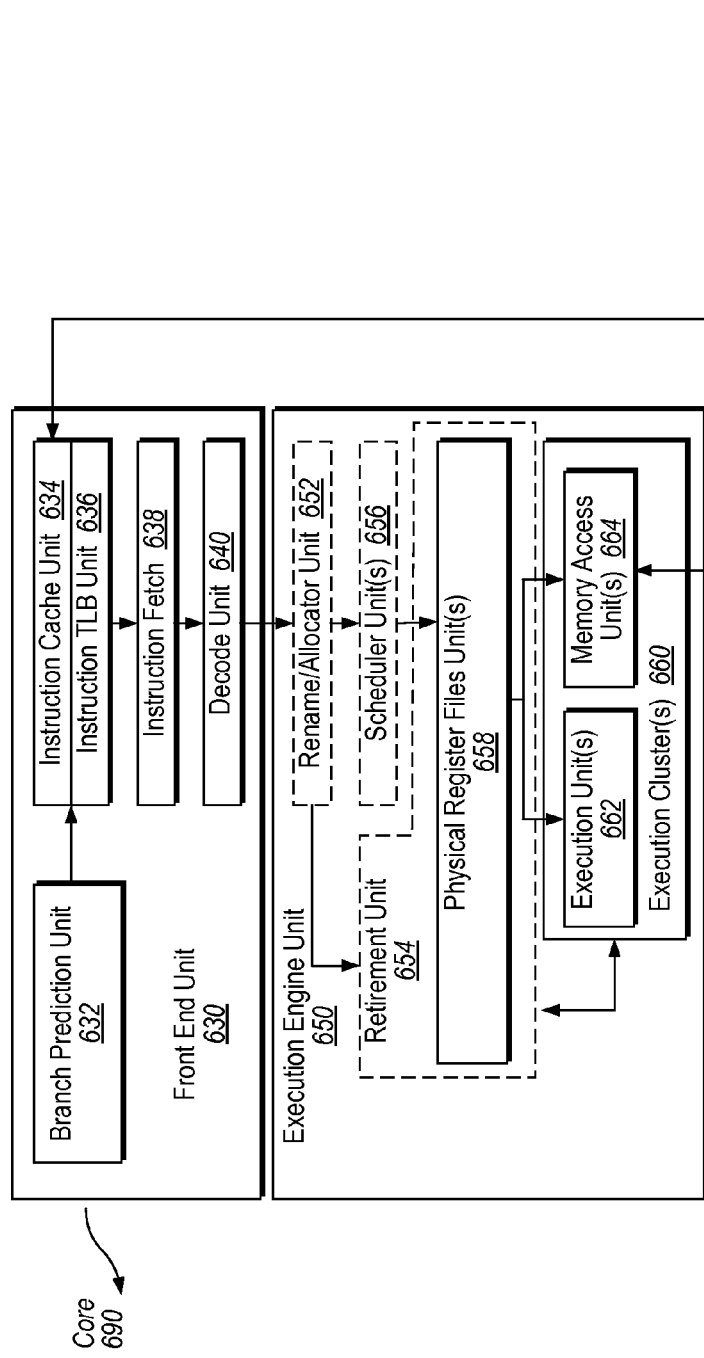

COMMON PLATFORM FOR ONE-LEVEL MEMORY ARCHITECTURE AND TWO-LEVEL MEMORY ARCHITECTURE Embodiments described herein generally relate to processing devices and, more specifically, relate to technologies for common platforms for one-level memory architectures and two-level memory architectures and operating the same.

BACKGROUND

In computing, memory refers to the physical devices used to store programs (e.g., sequences of instructions) or data (e.g. program state information) on a temporary or permanent basis for use in a computer or other digital electronic devices. The terms "memory," "main memory" or "primary memory" can be associated with addressable semiconductor memory, i.e. integrated circuits consisting of silicon-based transistors, used for example as primary memory in computers.

BRIEF DESCRIPTION OF THE DRAWINGS

FIG. 6A is a block diagram illustrating an in-order pipeline and a register renaming stage, out-of-order issue/execution pipeline according to one embodiment.

FIG. 6B is a block diagram illustrating a micro-architecture for a processor that implements dynamic heterogeneous hashing according to one embodiment.

DESCRIPTION OF EMBODIMENTS

Embodiments of the disclosure provide a common platform for 1LM architectures and 2LM or other multi-level memory architectures managed by one or more multi-level memory controllers. In one embodiment, a processor includes a first memory interface coupled to a first memory device that is located off-package of the processor and a second memory interface coupled to a second memory device that is located off-package of the processor. The processor also includes a multi-level memory controller (MLMC) coupled to the first memory interface and the second memory interface. The MLMC includes a first configuration and a second configuration. The first memory device is a random access memory (RAM) of a one-level memory (1LM) architecture in the first configuration. The first memory device is a first-level RAM of a two-level memory (2LM) architecture in the second configuration. The second memory device is a second-level non-volatile memory (NVM) of the 2LM architecture in the second configuration.

In another embodiment, a System on Chip (SoC) includes multiple functional hardware units and the MLMC coupled to the multiple functional hardware units, the MLMC to support a 1LM architecture and a 2LM architecture. The 1LM architecture may include a DRAM for system memory and a second memory interface is unpopulated. The multi-level memory architecture may include a first-level DRAM (also referred to herein as near memory) that is located off-package of the SoC and a second-level NVM (also referred to herein as far memory) that is located off-package of the SoC.

Current DRAM memory technologies deliver a wide range of attributes with distinct power, performance and price tradeoffs. Some DRAM types can be optimized for lower active power but are expensive to manufacture and include in the SoC package, while other DRAM technologies can have higher active power but are cheaper to manufacture and include in the system. The embodiments described herein are directed to a common platform that supports 1LM configurations and 1LM architectures and supports 2LM configurations and 2LM architectures. The term 2LM refers to two-level memory architecture, the term 2LM-DDR refers to a two-level memory architecture using double data rate (DDR) memory technologies, and the term MLM refers to two or more level memory architecture. The term 1LM refers to a single-level memory architectures and the term 1LM-DDR refers to a single-level memory architecture using DDR memory technologies.

Figure 2:
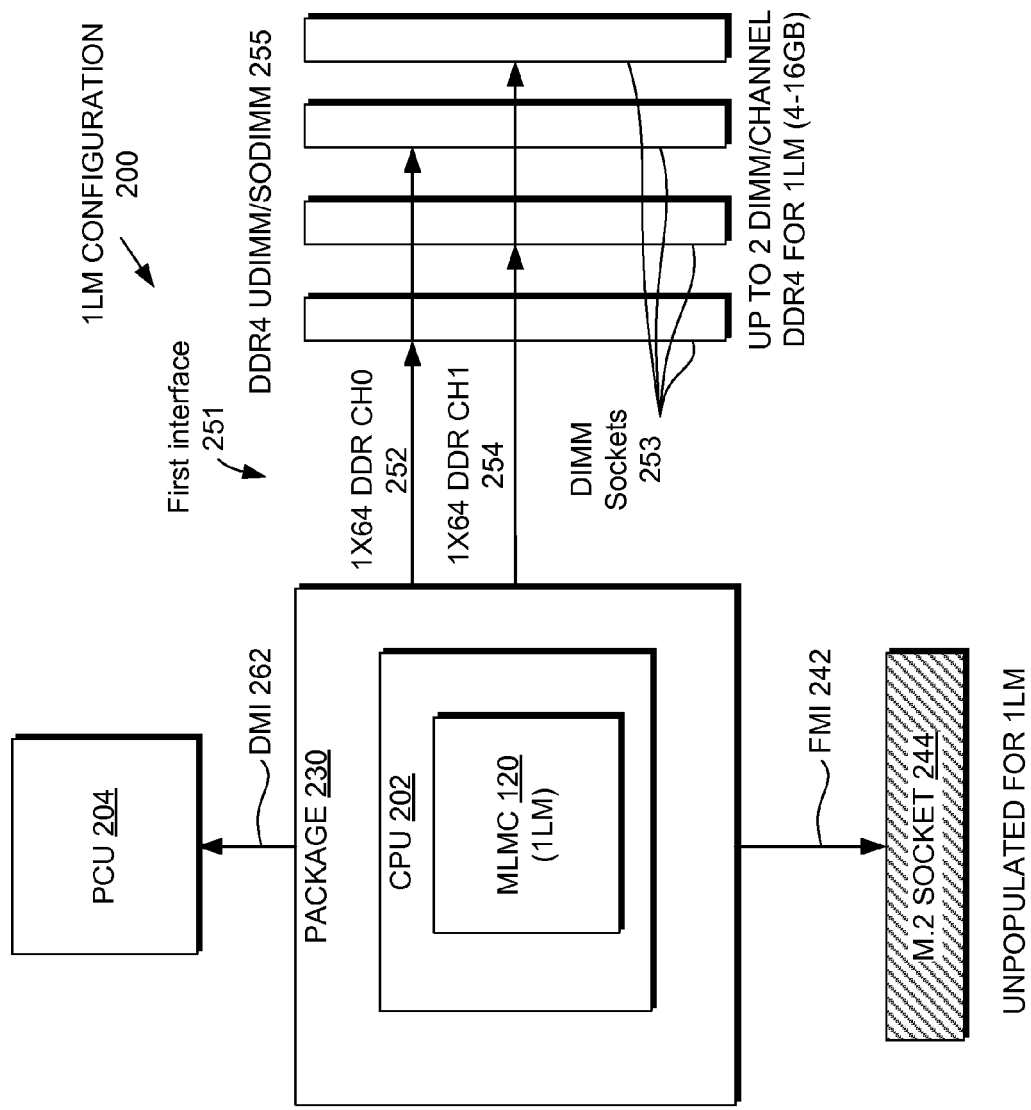
FIG. 2 is a block diagram illustrating a MLMC in the 1LM configuration according to one embodiment.
Figure 3:
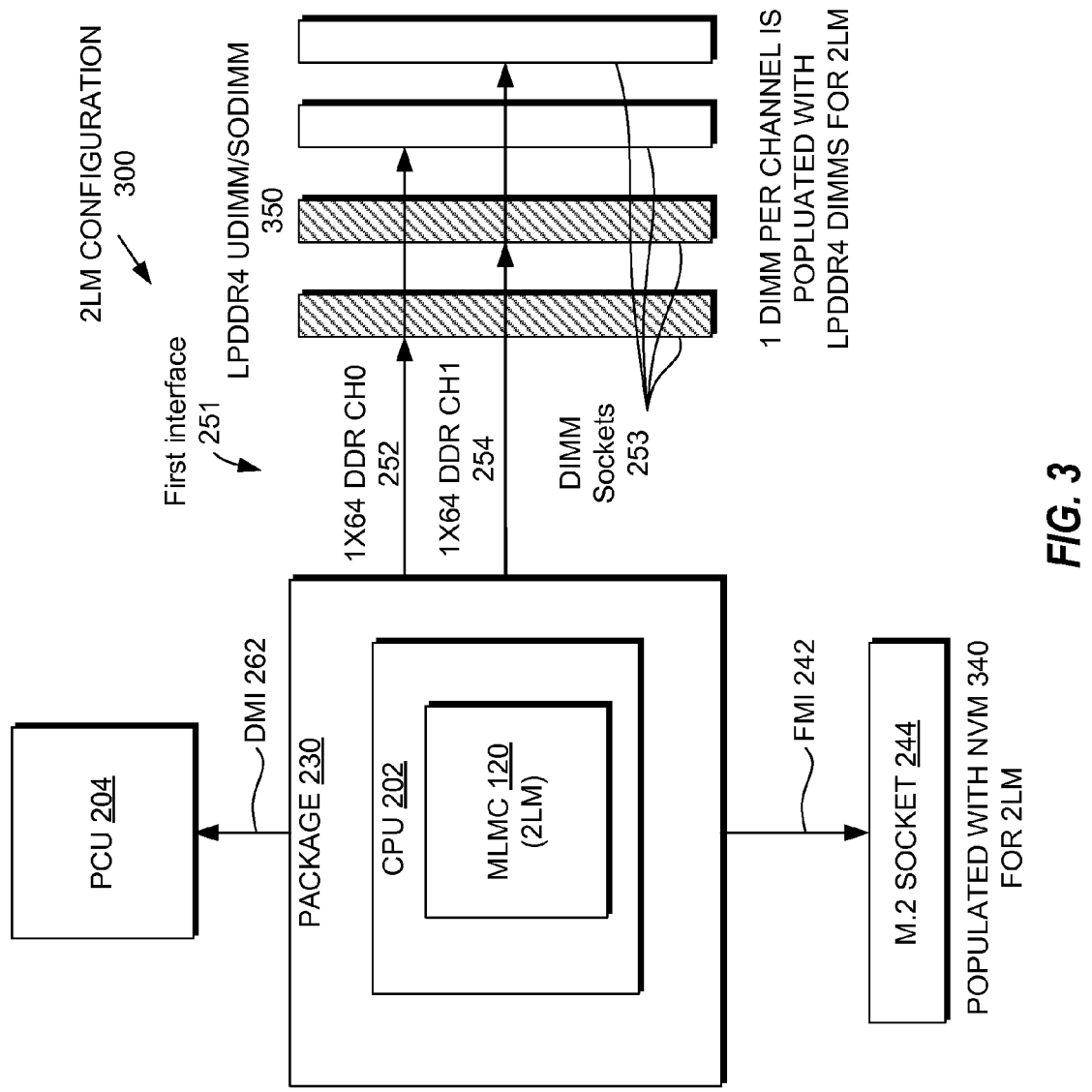
FIG. 3 is a block diagram illustrating a MLMC in the 2LM configuration according to one embodiment.

In traditional caching architectures, the main memory is considered "back-up" memory that is inclusive of all the data residing in the cache hierarchy. This works well when the cache sizes are relatively small compared to main memory. For example, on-die SRAM caches may be few megabytes (MBs) in size and main memory may be several gigabytes (GBs). In the 1LM configurations described herein, the off-package 1LM memory 155 can be used as main memory, such as illustrated in FIG. 2. In the 2LM configurations described herein, the off-package 2LM near memory 150 can be used as near memory and the off-package NVM can be used as far memory 140, such as illustrated in FIG. 3. In this 2LM configuration, the first memory NM (e.g., LPDDR4), may be used like a cache to capture the working set while the second memory, FM, (or a portion of the FM) (e.g., NVM) may be used as system memory. The embodiments of the 1LM or MLM (e.g., 2LM) architectures may use a sub-system interconnect architecture to support the 1LM and MLM architectures more effectively than previous solutions, such as illustrated with respect to FIG. 4.

Figure 1:
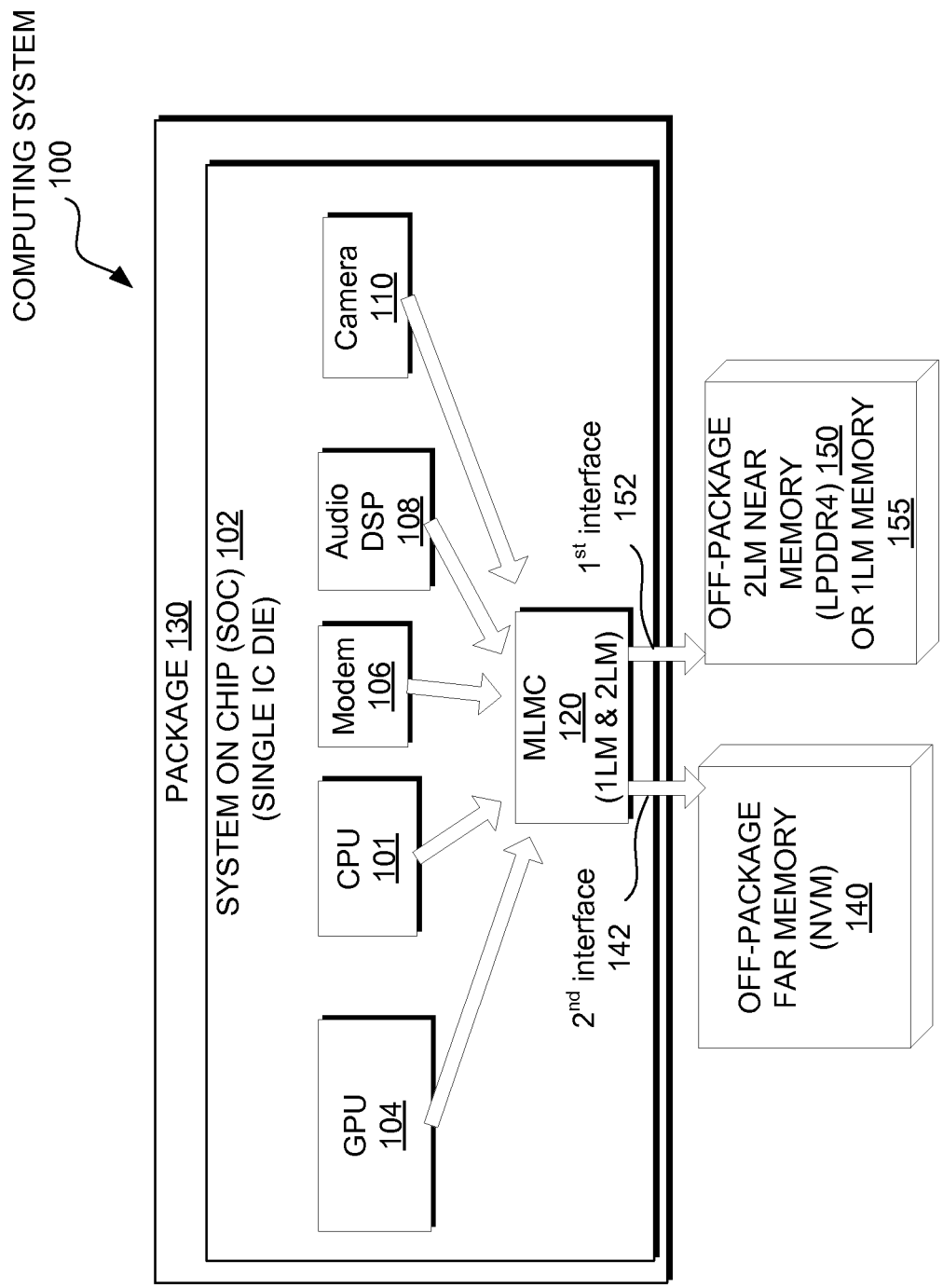
FIG. 1 is a block diagram illustrating a computing system that implements a multi-level memory controller (MLMC) for a one-level memory (1LM) configuration and a two-level memory (2LM) configuration according to one embodiment.

FIG. 1 is a block diagram illustrating a computing system 100 that implements a multi-level memory controller (MLMC) 120 for a 1LM configuration and a 2LM configuration according to one embodiment. The computing system 100 includes a System on Chip (SoC) 102. The SoC 102 may include multiple functional hardware units, including, for example, one or more central processing units (CPUs) 101, one or more graphics processing units (GPUs) 104, a modem 106, an audio digital signal processor (DSP) 108, a camera processing unit 110, and a display system unit 112, each of which are coupled to the MLMC 120. These functional hardware units may be processor cores, graphics cores (also referred to as graphics units), cache elements, computation elements, voltage regulator (VR) phases, input/output (I/O) interfaces, and their controllers, network controllers, fabric controllers, or any combination thereof. These functional units may also be logical processors, which may be considered the processor cores themselves or threads executing on the processor cores. A thread of execution is the smallest sequence of programmed instructions that can be managed independently. Multiple threads can exist within the same process and share resources such as memory, while different processes usually do not share these resources.

The components of FIG. 1 can reside on "a common carrier substrate," such as, for example, an integrated circuit ("IC") die substrate, a multi-chip module substrate or the like. Alternatively, the computing system 100 may reside on one or more printed circuit boards, such as, for example, a mother board, a daughter board or other type of circuit card. In other implementations, the main memory and the computing system 100 can reside on the same or different carrier substrates.

The SoC 102 may be integrated on a single integrated circuit (IC) die within a package 130. The MLMC 120 is coupled to off-package 2LM near memory 150 or 1LM memory 155 and is coupled to off-package 2LM near memory 150 (or off-package 1LM memory 155) (e.g., NVM). The off-package far memory 140 may be one or more memory devices that are integrated in a package that is separate from the package 130, such as an expansion card that plugs into an expansion card socket of the computing system 100. The off-package 2LM near memory 150 may be one or more memory devices that are integrated in a package that is separate from the package 130, such as memory devices of one or more dual in-line memory modules (DIMMs) that plug into one or more DIMM sockets 253 of the computing system 100. The off-package 1LM memory 155 may be one or more memory devices that are integrated in a package that is separate from the package 130, such as memory devices of one or more DIMMs that plug into one or more of the same DIMM sockets 253.

The MLMC 120 is a digital circuit which manages the flow of data going to and from the off-package far memory 140, the flow of data going to and from the off-package 1LM memory 155 when in the 1LM configuration, and the flow of data going to and from off-package 2LM near memory 150 when in the 2LM configuration. The off-package 2LM near memory 150 is not part of the package 130 and can be one or more memory devices that may be part of a dual in-line memory module (DIMM) as a series of memory ICs (e.g., DRAMs). These modules may be mounted on a printed circuit board that can be plugged into a socket of a motherboard upon which the package 130 is mounted. The off-package far memory 140 is not part of the package and can be one or more memory devices that may be part of an expansion card that can be plugged into an expansion card socket of the motherboard. Alternatively, the off-package memory can be mounted on the same circuit boards upon which the package 130 is mounted. Alternatively, other configurations of the off-package far memory 140 and the off-package 2LM near memory 150 (or off-package 1LM memory 155) are possible.

In the 1LM configuration, the off-package 1LM memory 155 operates as system memory in a single-level memory architecture. In the 2LM configuration, the off-package 2LM near memory 150 operates as a first level in a multi-level memory architecture and the off-package far memory 140 operates as a second level in the multi-level memory architecture. In the following disclosure, low-power double data rate 4 (LPDDR4) dynamic random access memory (DRAM) is used in various embodiments of the off-package 2LM near memory 150 and LPDDR3 DRAM is used in various embodiments of the off-package 1LM memory 155, but other memory technologies with similar characteristics would also work. For example, the off-package 2LM near memory 150 and off-package 1LM memory 155 may be different combinations of LPDDR4, DDR4, LPDDR3, DDR3, or DDR3L DRAM. In one embodiment, the off-package far memory 140 is a first memory type and the 2LM near memory 150 (or off-package 1LM memory 155) is a second memory type that is different than the first type. In other embodiments, the 2LM near memory 150 and 1LM memory 155 may be the same types of memories or different types of memories.

There may be other configurations of the computing system 100, such as a Package on Package (PoP) configuration. PoP is an integrated circuit packaging method that combines vertically discrete logic and memory ball grid array (BGA) packages. Two or more packages are installed atop each other, i.e., stacked, with an interface to route signals between them. PoP configurations allow higher component density in devices, such as mobile phones, personal digital assistants (PDA), tablets, digital cameras and the like. For example, the SoC 102 can be in a first package on the bottom (side closest to motherboard) and a memory package on the top. Other configurations are stacked-die packages where multiple integrated circuit dies are stacked instead of packages as described above.

The memory subsystem of the SoC 102 includes the MLMC 120 to manage the single-level memory architecture in the 1LM configuration and the 2LM multi-level memory architecture in the 2LM configuration. During operation, the MLMC 120 receives memory requests from functional units (e.g., CPU 101, GPU 104, modem 105, audio DSP 108, camera 110 or other devices). In the 1LM configuration, the MLMC 120 maps the memory requests to the off-package 1LM memory 155 (hereinafter 1LM memory 155). In the 2LM configuration, the MLMC 120 maps the memory request to either the off-package 2LM near memory 150 (hereinafter NM 15) or the off-package far memory 140 (hereinafter FM 140) according to a memory management scheme. In some embodiments, the MLMC 120 is to write data into a memory page of NM 150 in response to a request from the requesting unit to retrieve the memory page from FM 140. In 2LM configurations, the MLMC 120 is to interact with the first memory device 150 as near memory in the 2LM architecture and with the second memory device 140 as far memory in the 2LM architecture. Additional details regarding the operation of the MLMC 120 is described below with respect to FIGS. 3-5.

In one embodiment, the MLMC 120 is coupled to the NM 150 (or the 1LM memory 155) via a first memory interface 152 and to the FM 140 via a second memory interface 142. The first memory interface 152 may be a DDR memory interface and the second memory interface 142 is an expansion card interface. For example, the second memory interface 142 may be a M.2 interface. M.2, formerly known as the Next Generation Form Factor (NGFF), is a specification for computer expansion cards and associated connectors. In other embodiments, the second memory interface 142 may be other types of interfaces, such as mSATA, which used the PCI Express Mini Card physical layout, or the like. M.2. is intended to replace mSATA. The M.2 interface may be more suitable for solid-state storage applications in general, especially when used in small devices like ultrabooks or tablets. The M.2 interface is a small form factor implementation of the SATA Express interface, with the addition of an internal USB 3.0 port. In another embodiment, the first memory device includes DDR DRAM in both configurations. For example, DDR3 or DDR4 DRAM can be used in the 1LM configuration and LPDDR3 or LPDDR4 can be used in the 2LM configuration. In a further embodiment, the second memory interface 142 includes pins (e.g., 31 pins) for a direct connection between the SoC 102 (or a processor) and the second memory device 140.

The computing system 100 may include one or more functional units that execute instructions that cause the computing system to perform any one or more of the methodologies discussed herein. The computing system 100 may be connected (e.g., networked) to other machines in a LAN, an intranet, an extranet, or the Internet. The computing system 100 may operate in the capacity of a server or a client device in a client-server network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated for the computing system 100, the term "machine" shall also be taken to include any collection of machines that individually or jointly execute a set (or multiple sets) of instructions to perform any one or more of the methodologies discussed herein.

In addition to the illustrated components, the computing system 100 may include one or more processors, one or more main memory devices, one or more static memory devices and one or more data storage device, which communicate with each other via a bus. The processors may be one or more general-purpose processing devices such as a microprocessor, central processing unit, or the like. More particularly, the processing device may be complex instruction set computing (CISC) microprocessor, reduced instruction set computer (RISC) microprocessor, very long instruction word (VLIW) microprocessor, or processor implementing other instruction sets, or processors implementing a combination of instruction sets. The processor may also be one or more special-purpose processing devices such as an application specific integrated circuit (ASIC), a field programmable gate array (FPGA), a digital signal processor (DSP), network processor, or the like. In one embodiment, processor may include one or processing cores. The processor is configured to execute the processing logic for performing the operations discussed herein. In one embodiment, processor is the same as SoC 102 of FIG. 1 that implements one or more MLMCs 120. Alternatively, the computing system 100 can include other components as described herein, as well as network interface device, video display units, alphanumeric input devices, cursor control devices, a signal generation device, or other peripheral devices.

In another embodiment, the computing system 100 may include a chipset (not illustrated), which refers to a group of integrated circuits, or chips, that are designed to work with the SoC 102 and controls communications between the SoC 102 and external devices. For example, the chipset may be a set of chips on a motherboard that links the CPU 101 to very high-speed devices, such as 2LM near memory 150 (or off-package 1LM memory 155) and graphic controllers, as well as linking the CPU 101 to lower-speed peripheral buses of peripherals, such as USB, PCI or ISA buses.

The data storage device (not illustrated) may include a computer-readable storage medium on which is stored software embodying any one or more of the methodologies of functions described herein. The software may also reside, completely or at least partially, within the main memory as instructions and/or within the SoC 102 as processing logic during execution thereof by the computing system 100. The computer-readable storage medium may also be used to store instructions for the operations of the MLMC 120, and/or a software library containing methods that call the above applications. Alternatively, the MLMC 120 may include firmware that executes the instructions.

Some conventional 2LM memory systems may have a small, fast and expensive NM (Near Memory) used as a cache and a larger, slower and cheaper FM (Far Memory) used as the system memory. One conventional 2LM architecture proposes using in-package memory such as wide input-output 2 (WIO2) as the NM. WIO2 allows much lower mW/GBps, higher peak bandwidth and better system form-factor and is a great choice for mobile/handheld systems. However, WIO2 may be more expensive (compared to off-package DDR) and may have performance issues due to thermals in higher wattage systems. The use of on-package WIO2 may reduce original equipment manufacturer (OEM) flexibility for upgrades or configurations and may require developing a new platform and SoC for inventory. As a result, using on-package memory for NM may be a poor choice for desktop computing systems where flexibility and cross-stock keeping unit (SKU) compatibility can be very important. Since the performance of a significant portion of the desktop systems is not limited in thermal design power (TDP) and more like Vmax/Fmax limited, the on-package WIO2 power benefit does not translate into much additional performance in 2LM architectures for desktop systems. Also, form-factor is not a first-order issue for desktop systems, so the main advantage of on-package WIO2 is not less important in desktop systems. The embodiments described herein can be variants of the conventional 2LM architectures with on-package WIO2, where off-package DDR memory is used as a memory-side cache (Near Memory) and NVM is used as the system memory (Far Memory). The embodiments described herein can provide a common platform for 1LM and 2LM for desktop systems. For example, a LPDDR4-based unbuffered DIMM (UDIMM) or a small outline DIMM (SoDIMM) design can be used in a 2LM configuration and a DDR4-based UDIMM/SoDIMM design can be used in a 1LM configuration. The two memory designs can be connector-compatible. The embodiments described herein may use a common connector for both DDR4 and LPDDR4 based UDIMM/SoDIMM.

The embodiments described herein may relieve some of the cost pressure on the system manufacturer (OEM) with conventional 2LM architectures. The embodiments described herein may not have any thermal related performance issues with on-package memory, and may give OEM flexibility for using both 1LM and 2LM configurations using the same platform and SoC. The embodiments described herein may keep the principal benefit of 2LM, which is system BOM (bill-of-material) reduction, by eliminating a significant portion of system DRAM and replacing with cheaper non-volatile storage. The embodiments described herein may address other issues associated with conventional 2LM architectures that have on-package memory, such as, for example, lack of flexibility, incompatibility with 1LM system, thermal scaling issues, or the like. Also, the embodiments described herein may provide flexibility such as an option to upgrade the NM capacity and bandwidth, and also having the same memory socket supporting DDR4 or LPDDR4 (i.e. 1LM and 2LM configurations in the same platform).

The embodiments described herein are directed to methods and hardware to use DDR as the NM and NVM as the FM in 2LM configurations. Also, described herein are embodiments of algorithms for using variable sizes of NM, and for having the ability to use DDR as a memory-side cache, while having compatibility with 1LM platforms. FIG. 2 illustrates a system architecture in the 1LM configuration (also referred to as 1LM mode) and FIG. 3 illustrates the same system architecture in the 2LM configuration (also referred to as 2LM mode).

In one embodiment of the 2LM, the MLMC 120 is to operate as a cache controller that manages the first-level DRAM (near memory 150) as a hardware-managed cache. For example, the MLMC 120 may determine in which of the first-level DRAM (e.g., near memory 150) or a second-level NVM 140 the memory requests resides through a cache lookup. The MLMC 120 may also be responsible for determining which memory a request should ideally reside in. In one implementation, the MLMC 120 manages the near memory 150 as a hardware-managed cache in which frequently accessed pages are kept and the rarely used pages are left in far memory 140. Alternatively, the MLMC 120 can use other management schemes. The system-addressable memory blocks of the contiguous addressable memory space may reside in one or more both of the far memory 140 or the near memory 150 at any given time. The multi-level memory architecture may be a pointer-based memory architecture. The MLMC 120 tracks where a given system-addressable memory block is currently residing through a cache lookup table. The cache lookup table can be store in a dedicated region of far memory 140 or a dedicated region of near memory 150. This dedicated region may not be advertised to the software or can be protected in other ways. In another embodiment, the contiguous addressable memory space is divided into sets and ways for caching techniques.

FIG. 2 is a block diagram illustrating a MLMC 120 in the 1LM configuration 200 according to one embodiment. In this embodiment, the MLMC 120 is part of a CPU 202 of a package 230. The CPU 202 includes a first memory interface 251, a far memory interface (FMI) 242, and a direct media interface (DMI) 262. The first memory interface 251 couples the CPU 202 to multiple DIMM sockets 253 (4 DIMM sockets illustrated) into which DDR4 UDIMM/SoDIMM 255 are plugged. In this embodiment, the 1LM configuration 200 has two channels 252, 254 of DDR4 UDIMMs/SoDIMMs 255 with up to two DIMMs per channel, giving the CPU 202 a memory capacity of approximately 4 GB to approximately 16 GB of system memory. The M.2 socket 244 is unpopulated in the 1LM configuration 200. The FMI 242 couples the CPU 202 to a M.2 socket 244, which may be unpopulated for 1LM configuration 200. The DMI 262 couples the CPU 202 to a platform controller hub (PCH) 204. The PCH 204 may be a family of microchips that control certain data paths and support functions used in conjunction with the CPU 202.

As described below, the same system as in the 1LM mode can be configured in a 2LM mode, as described below with respect to FIG. 3.

FIG. 3 is a block diagram illustrating a MLMC 120 in the 2LM configuration 300 according to one embodiment. In the 2LM configuration 300, only 1 DIMM per channel is populated with LPDDR4 UDIMM/SoDIMM 350 and the M.2 socket 244 is populated with a NVM 340 to achieve a large system memory (larger FM) with less cost than NM. LPDDR4 can be used for NM because of much better cost per bandwidth; however, other memory technologies can also be used if appropriate. The DIMM version of LPDDR4 provides flexibility such as option to upgrade the Near Memory capacity and bandwidth, and also having the same socket supporting DDR4 or LPDDR4, supporting 1LM and 2LM configurations 200, 300 in the same platform. In one embodiment, a single common connector can be used for the LPDDR4-based UDIMM/SoDIMM in the 2LM configuration 300 and the DDR4 UDIMM/SODIMM in the 1LM configuration 200. In other embodiments, different connectors can be installed based on the selected configuration for the desktop system.

The table below illustrates different LPDDR4 configurations compared to 2LM architectures using WIO2 as near memory. LPDDR4 capacity is dictated by required minimum peak bandwidth (B/W). As illustrated in the table, assuming 2.667 GT/s data rate for a socketed LPDDR4 with 1 DIMM/channel and 1 rank/DIMM, to match a system with 1LM (DDR4-2400), LPDDR4-2667 4×32 (e.g., 4 GB) can be used, for example. For a low/mid desktop system, 3×32 or even 2×32 configurations may be used.

| Memory Technology | WIO2-800 | WIO2-1067 | LPDDR4-3200 | LPDDR4-2667 | LPDDR4-2667 | LPDDR4-2667 | LPDDR4-2400 |
|---|---|---|---|---|---|---|---|
| Channel configuration | 8 × 64 | 8 × 64 | 3 × 32 | 2 × 32 | 3 × 32 | 4 × 32 | 4 × 32 |
| Capacity (GB) | 2 | 2 | 3 | 2 | 3 | 4 | 4 |
| Bandwidth (GB/s) | 50 | 68 | 38 | 21 | 32 | 42 | 38 |

In some embodiment, a single board for OEM flexibility and backward compatibility can be used to support both 1LM and 2LM configurations 200, 300. Some factors to consider are described below.

1. The DIMM sockets 253 can be populated with LPDDR4 based DIMM 350 in the 2LM configuration 300 and DDR4/DDR3L based DIMM 255 for 1LM configuration 200. For 2LM configuration 300, one DIMM per channel can be used so half the DIMM sockets 253 may be unconnected and dummy termination may be needed. Also, both the 1×32 (half channel) and 2×32 (full channel) LPDDR4 DIMM 350 may be needed (socket is still the same) for upgradability/flexibility.

2. The DDR voltage regulator (VR) may need to support 1.1V for LPDDR4. The VR may also be configurable between 1LM voltages (1.35V for DDR3L if needed, 1.2V for DDR4) and 2LM voltage (1.1V).

3. The NVM 340 in 2LM configuration 300 is connected via a M.2 socket 244. The socket 244 is unpopulated in 1LM configuration 200 and populated in 2LM configuration 300. The NVM 340 can be partitioned to be used as both main memory and disk cache or main memory only.

4. A number of pins, such as 31 pins, can be used for the FMI 242 in the CPU die 202 and package 230 to connect directly to the NVM 340.

Figure 4:
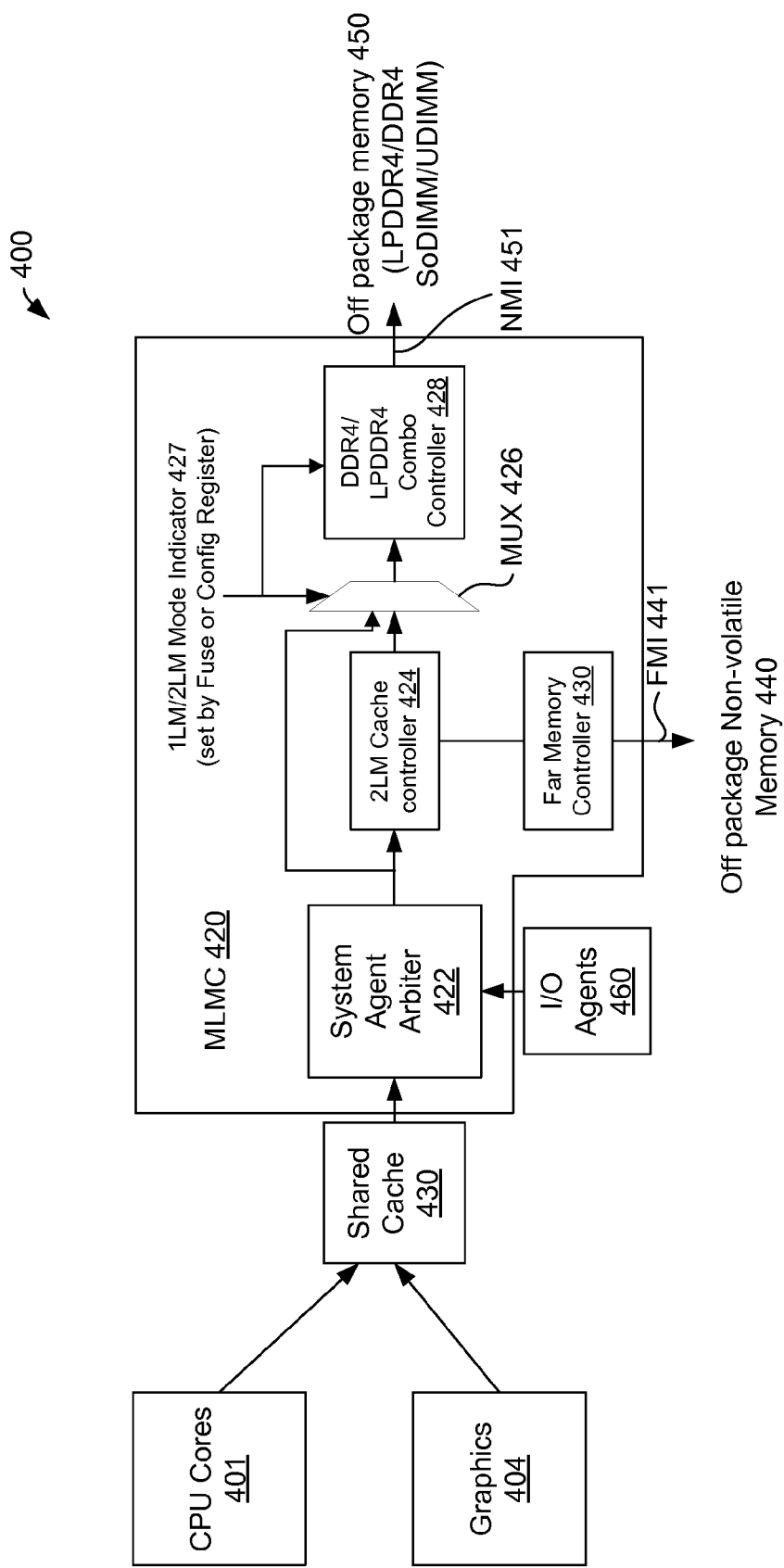
FIG. 4 is a block diagram illustrating a CPU microarchitecture to support the 1LM and 2LM modes of operation according to one embodiment.

FIG. 4 is a block diagram illustrating a CPU microarchitecture 400 to support the 1LM and 2LM modes of operation according to one embodiment. In this embodiment, the CPU microarchitecture 400 includes a MLMC 420 coupled to a shared cache 430. The shared cache 430 is coupled to one or more CPU cores 401 and one or more graphic cores 404. The shared cache 430 may also be coupled to other functional units of a processor or SoC. In this embodiment, the MLMC 420 includes a 2LM cache controller 424, a NM controller 428 (labeled as DDR4/LPDDR4 combo controller) that is coupled to a near memory interface (NMI) 451, and a FM controller 430 that is coupled to a FMI 441 and the 2LM cache controller 424. The MLMC 420 also includes a system agent arbiter 422 coupled to the shared cache 430 and the 2LM cache controller 424 and a multiplexer 426. The multiplexer 426 includes a first input coupled to an output of the 2LM cache controller 424, a second input coupled to an output of the system agent arbiter 422, and an output coupled to the NM controller 428. The multiplexer 426 is to select between the first input and the second input based on an indicator 427 (1LM/2LM mode indicator) that specifies the first configuration or the second configuration. The indicator 427 can be set by fuse, a configuration register, or the like.

During operation, a memory request for a memory page can be received at the shared cache 430 from a requesting unit, such as one of the CPU cores 401 or the graphic cores 404. When the memory page is not stored in shared cache 430, the memory request is received at the system agent arbiter 422. When the indicator 427 is set to 1LM mode, the system agent arbiter 422 sends the memory request to the NM controller 428 directly via the multiplexer 426, bypassing the 2LM cache controller 424. When the indicator 427 is set to 2LM mode, the system agent arbiter 422 sends the memory request to the 2LM cache controller 424. The 2LM cache controller 424 determines whether an address of the memory request is located in NM 450. When the address is in the NM 450, the 2LM cache controller 424 sends the memory request to the NM controller 428 and the NM controller 428 communicates with the NM 450 over the NMI 451 to service the memory request. When the address is not in the NM 450, the 2LM cache controller 424 sends the memory request to the FM controller 430 and the FM controller 430 communicates with the FM 440 over the FMI 441 to service the memory request. In a further embodiment, the system agent arbiter 422 can also be configured to receive requests from input-output (I/O) agents 460 as a requesting unit.

In one embodiment, the MLMC 420 is implemented as a system interconnect between the requesting units and the memory devices in the 1LM configuration and the memory devices in the 1LM configuration in a common platform. In the depicted embodiment for 2LM, the system interconnect fabric includes DDR (e.g., LPDDR4) as the near memory and NVM as the far memory. The NM controller 428 is a NM D-unit for the two NM channels (e.g., ch0 252, ch1 254) while the FM controller 430 is a FM D-unit for the FM channels (e.g., 242). The FM D-unit is coupled to the FM channel, which is to be coupled to a FM device and the NM D-unit is coupled to the NM channels, which are to be coupled to a NM device. In other embodiments, additional near memory devices can be added to scale the amount of near memory for cache. In other embodiments, additional units can be used to coordinate multiple NM D-units or multiple FM D-Units, or multiple MLMCs, such as an arbiter, a crossbar switch, or the like. The microarchitecture shown in FIG. 4 has two near memory channels (e.g., LPDDR4 channels, such as DDR ch0 252 and DDR Ch1 254) and one far memory channel (NVM channel). However, the micro-architecture of FIG. 4 is scalable to support more channels if higher bandwidth and capacity is needed in the system.

In one embodiment, a memory request is received at the system agent arbiter 422 from one of the CPU 401, GPU 403 or other I/O agents 460, and the system agent arbiter 422 directs the memory request to the 2LM cache controller 424 or NM controller 428 directly as described herein. The 2LM cache controller 424 can perform a lookup to map the memory request to either near memory 450 or far memory 440 when in the 2LM configuration. If the lookup results in the memory request being mapped to near memory (which may be considered a cache hit), the 2LM cache controller 424 directs the memory request to the NM D-unit (NM controller 428) 0, which can further decode the memory request to determine a channel. If the lookup results in the memory request being mapped to far memory (which may be considered a cache miss), the 2LM cache controller 424 directs the memory request to the FM D-unit (FM controller 430), which interfaces with the NVM channel.

The system memory space in FM 440 includes multiple blocks, Block 0 to Block N. To the OS and firmware, the system memory space appears as one contiguous addressable memory. In some cases, the entire capacity of the FM 440 is used as system memory. In other cases, a portion of the capacity of the FM 440 can be designated as system memory. During operation, the MLMC 420 may keep track of where a given system-addressable memory block is currently residing through a lookup table (which may be akin to a tag array of a traditional cache) and associated cache-controller hardware. In one embodiment, the total system memory of the memory space is divided in to "sets" and "ways", similar to a traditional cache. For each set, some of the ways reside in the near memory 450 (LPDDR4) and the rest in the far memory 440 (NVM). In another embodiment, a portion of the near memory 450 (or shared cache 430) is reserved for a lookup table for the MLMC 420. The lookup table includes N entries, where N is equal to a number of sets in the addressable memory space. Each of the N entries includes a set of M pointers, where M is equal to the number of ways in the sets. The set of M pointers store way numbers of where memory blocks that map to a particular set and set-offset currently resides.

In another embodiment, a computer platform includes a central processing unit (CPU) die and package and a circuit board, the circuit board including a CPU socket in which the CPU die and package is connected, a first memory socket in which a first memory device is connected to the CPU die and package, and a second memory socket in which a second memory device is connected to the CPU die and package. The CPU die and package includes one or more processors, a first memory interface coupled to the first memory socket, a second memory interface coupled to the second memory socket, and a multi-level memory controller (MLMC) coupled to the first memory interface and the second memory interface. The MLMC includes a one-level memory (1LM) configuration and a two-level memory (2LM) configuration for the computer platform. The MLMC is to interact with the first memory device as near memory in the 2LM configuration and with the second memory device as far memory in the 2LM architecture.

In a further embodiment, the second memory device is a non-volatile memory (NVM) in the 2LM configuration and the first memory device is at least one of double data rate 3 (DDR3) dynamic random access memory (DRAM) or DDR4 DRAM in the 1LM configuration and the first memory device is low power DDR4 (LPDDR) in the 2LM configuration. In another embodiment, the first memory socket is a dual in-line memory module (DIMM) socket and the second memory socket is an expansion card socket. In another embodiment, the first memory device is at least one of a small outline DIMM (SoDIMM) or an unbuffered DIMM (UDIMM).

In a further embodiment, the MLMC includes a 2LM cache controller, a near memory (NM) controller coupled to the first memory interface, a far memory (FM) controller coupled to the second memory interface and the 2LM cache controller, a system agent arbiter coupled to a requesting unit and the 2LM cache controller, and a multiplexer including a first input coupled to an output of the 2LM cache controller, a second input coupled to an output of the system agent arbiter, and an output coupled to the NM controller. The multiplexer is to select between the first input and the second output based on an indicator that specifies the 1LM configuration or the 2LM configuration.

In another embodiment, the memory requests originating from CPU cores 401 and graphic cores 404 is be first serviced by the shared cache 430 (also referred to as last-level cache). The requests that miss the cache or are uncacheable are forwarded to the system agent arbiter 422. The system agent arbiter 422 also receives memory requests from the I/O subsystem, such as from I/O agents 460. If the CPU is configured in 1LM mode of operation, the system agent arbiter 422 sends all the memory requests directly to the DDR4/LPDDR4 Combo Memory Controller 428 (indicated by one input to the multiplexer 426). The 1LM system typically has DDR4 memory modules, so the combo controller 428 can work in DDR4 mode. If the CPU is configured as 2LM mode of operation, the requests are first send to the 2LM Cache Controller 424. The 2LM cache controller 424 determines whether the request address is located in the LPDDR4 memory DIMMs ("Near Memory") or located in the Far Memory module (Non-volatile memory). If the 2LM Cache controller 424 determines that the request address is located in LPDDR4 DIMM, then the request are sent to the LPDDR4/DDR4 Combo controller 428. In this case, the Combo Memory Controller 428 is operating in LPDDR4 mode. Similarly, if the request address is resident in the Far Memory module, the memory page is first allocated and potentially filled in the Near Memory cache (LPDDR4 DIMM), and after that memory operation (read/write) is done on the Near Memory (LPDDR4 DIMM).

The "Mode of Operation" (1LM or 2LM) for the CPU can be statically set by the system builder by setting a strap or fuse bit in the CPU. It can also be dynamically configured by the BIOS. In this case, BIOS can detect the availability of the LPDDR4/DDR4 DIMMS and Non-volatile memory module in the system, and automatically set the mode of operation to 2LM. The dynamic configuration may allow a system to be upgraded to 2LM in the "field". For example, a system can be sold as a 1LM with DDR4 DIMMs and the M.2 socket unpopulated. If the user later decides to upgrade to 2LM, he/she can replace the DDR4 DIMMs with LPDDR4 DIMMs, and populate the M.2 socket with Non-volatile memory module. The BIOS detects the availability of LPDDR4 and Non-volatile memory in M.2 socket, and sets the mode of operation to 2LM.

Figure 5:
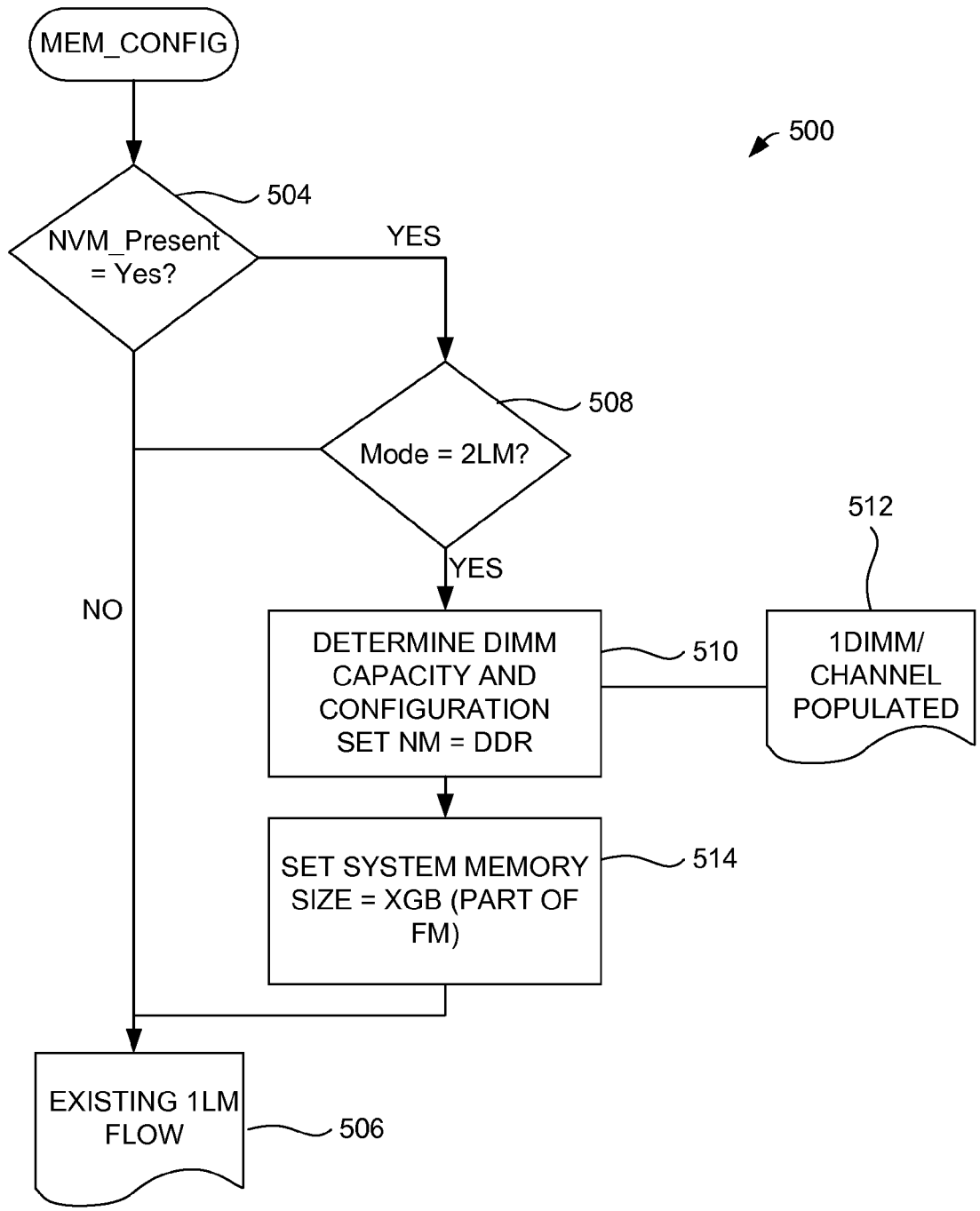
FIG. 5 is a flow diagram illustrating a method of memory initialization of a common platform for 1LM configuration and 2LM configuration according to one embodiment.

FIG. 5 is a flow diagram illustrating a method 500 of memory initialization of a common platform for 1LM configuration 200 and 2LM configuration 300 according to one embodiment. Method 500 may be performed by processing logic that may comprise hardware (e.g., circuitry, dedicated logic, programmable logic, microcode, etc.), software (such as instructions running on the MLMC), firmware or a combination thereof. In one embodiment, method 500 is performed by MLMC 120 of FIG. 1, or MLMC 120 of FIGS. 2-3. In another embodiment, the method 500 is performed by the MLMC 420 of FIG. 4. Alternatively, other components of the computing system 100, computing system of FIG. 2 or the system interconnect of FIG. 4 may perform some or all of the operations of the method 500.

Referring to FIG. 5, the method 500 begins by the processing logic begins configuring the memory by determining whether a second memory device (NVM for FM) is present in a computer platform (block 504). If the second memory device is not present, the processing logic presents to software a first addressable memory space of system memory based on a first capacity of a first memory device present in the computer platform in a one-level memory (1LM) configuration mode and continues with the existing 1LM configuration flow (block 506). However, when the second memory device is present, the processing logic determining whether the 2LM configuration mode is enabled (block 508). When the 2LM configuration mode is not enabled at block 508, the processing logic proceeds in 1LM configuration at block 506. When the 2LM configuration mode is enabled at block 508, the processing logic sets the first memory device (DDR) as near memory (NM) (block 510). The first memory device (DDR) has 1DIMM per channel populated with DDR memory devices (block 512). The processing logic also sets at least a portion of the second memory device (NVM) as far memory in the 2LM configuration (block 514), such as xGBs of FM as system memory. The processing logic can present to the software a second addressable memory space of system memory based on a size of the portion of FM set for system memory in the 2LM configuration mode. The processing logic proceeds with existing 1LM flow at block 506).

FIG. 5 illustrates the "unified" memory initialization flow that can be used in both 1LM and 2LM configurations on the same common platform. In the 2LM configuration 300, the DDR capacity can be read and set that as the NM size for the 2LM controller on the CPU. The system memory advertised to software can be the size of memory that is partitioned on the NVM device as "system memory", which could be, for example, between 4 GB to 32 GB for a desktop system. The unified memory utilization may give the OEMs the ability to use the same platform for both 1LM and 2LM system designs. 2LM configuration 300 provides lower system BOM. Using DDR as NM gives additional flexibility in the system design to have a variable NM size and does not have any of the thermal issues that may be present with on-package DRAM (WIO2). The 2LM configuration, as described herein, can allow a significant speedup of the storage subsystem by using part of the Far Memory NVM as storage cache together with relatively cheap hard drives, instead of the use of expensive hard drives or SSDs.

In another embodiment, the processing logic determines whether a second memory device is present in a computer platform comprising the processing logic. When the second memory device is not present, the processing logic presents to software a first addressable memory space of system memory based on a first capacity of a first memory device present in the computer platform in a one-level memory (1LM) configuration mode. When the second memory device is present, the processing logic sets the first memory device as near memory (NM) in a two-level memory (2LM) configuration mode, sets at least a portion of the second system device as far memory (FM) in the 2LM configuration mode, and presents to the software, by the MLMC, a second addressable memory space of system memory based on a size of the portion in the 2LM configuration mode.

In a further embodiment, when the second memory device is present at block 504, the processing logic determines a second capacity of the first memory device present and a configuration of the first memory device. For example, the processing logic can read a DDR capacitive of the first memory device and set a size of the NM in a 2LM controller.

During operation, processing logic of the MLMC receives a memory request for a memory page at a system agent arbiter of the MLMC. When in the 1LM configuration, the processing logic sends the memory request to a first memory controller coupled to the first memory device. When in the 2LM configuration, the processing logic sends the memory request to a 2LM cache controller, which determines whether an address of the memory request is located in NM. The memory request is sent to the first memory controller when the address is in the NM and the memory request is sent to a FM controller when the address is not in the NM, the FM controller being coupled to the second memory device. In one embodiment, when the memory page is not in the NM, the memory page can be allowed to the NM for future requests.

FIG. 6A is a block diagram illustrating a micro-architecture for a processor 600 that implements dynamic heterogeneous hashing according to one embodiment. Specifically, processor 600 depicts an in-order architecture core and a register renaming logic, out-of-order issue/execution logic to be included in a processor according to at least one embodiment of the disclosure.

Processor 600 includes a front end unit 630 coupled to an execution engine unit 650, and both are coupled to a memory unit 670. The processor 600 may include a reduced instruction set computing (RISC) core, a complex instruction set computing (CISC) core, a very long instruction word (VLIW) core, or another alternative core type. As yet another option, processor 600 may include a special-purpose core, such as, for example, a network or communication core, compression engine, graphics core, or the like. In one embodiment, processor 600 may be a multi-core processor or may be part of a multi-processor system.

The front end unit 630 includes a branch prediction unit 632 coupled to an instruction cache unit 634, which is coupled to an instruction translation lookaside buffer (TLB) 636, which is coupled to an instruction fetch unit 638, which is coupled to a decode unit 660. The decode unit 660 (also known as a decoder) may decode instructions, and generate as an output one or more micro-operations, micro-code entry points, microinstructions, other instructions, or other control signals, which are decoded from, or which otherwise reflect, or are derived from, the original instructions. The decoder 660 may be implemented using various different mechanisms. Examples of suitable mechanisms include, but are not limited to, look-up tables, hardware implementations, programmable logic arrays (PLAs), microcode read only memories (ROMs), etc. The instruction cache unit 634 is further coupled to the memory unit 670. The decode unit 660 is coupled to a rename/allocator unit 652 in the execution engine unit 650.

The execution engine unit 650 includes the rename/allocator unit 652 coupled to a retirement unit 654 and a set of one or more scheduler unit(s) 656. The scheduler unit(s) 656 represents any number of different schedulers, including reservations stations (RS), central instruction window, etc. The scheduler unit(s) 656 is coupled to the physical register file(s) unit(s) 658. Each of the physical register file(s) units 658 represents one or more physical register files, different ones of which store one or more different data types, such as scalar integer, scalar floating point, packed integer, packed floating point, vector integer, vector floating point, etc., status (e.g., an instruction pointer that is the address of the next instruction to be executed), etc. The physical register file(s) unit(s) 658 is overlapped by the retirement unit 654 to illustrate various ways in which register renaming and out-of-order execution may be implemented (e.g., using a reorder buffer(s) and a retirement register file(s), using a future file(s), a history buffer(s), and a retirement register file(s); using a register maps and a pool of registers; etc.).

Generally, the architectural registers are visible from the outside of the processor or from a programmer's perspective. The registers are not limited to any known particular type of circuit. Various different types of registers are suitable as long as they are capable of storing and providing data as described herein. Examples of suitable registers include, but are not limited to, dedicated physical registers, dynamically allocated physical registers using register renaming, combinations of dedicated and dynamically allocated physical registers, etc. The retirement unit 654 and the physical register file(s) unit(s) 658 are coupled to the execution cluster(s) 660. The execution cluster(s) 660 includes a set of one or more execution units 662 and a set of one or more memory access units 664. The execution units 662 may perform various operations (e.g., shifts, addition, subtraction, multiplication) and operate on various types of data (e.g., scalar floating point, packed integer, packed floating point, vector integer, vector floating point).

While some embodiments may include a number of execution units dedicated to specific functions or sets of functions, other embodiments may include only one execution unit or multiple execution units that all perform all functions. The scheduler unit(s) 656, physical register file(s) unit(s) 658, and execution cluster(s) 660 are shown as being possibly plural because certain embodiments create separate pipelines for certain types of data/operations (e.g., a scalar integer pipeline, a scalar floating point/packed integer/packed floating point/vector integer/vector floating point pipeline, and/or a memory access pipeline that each have their own scheduler unit, physical register file(s) unit, and/or execution cluster—and in the case of a separate memory access pipeline, certain embodiments are implemented in which only the execution cluster of this pipeline has the memory access unit(s) 664). It should also be understood that where separate pipelines are used, one or more of these pipelines may be out-of-order issue/execution and the rest in-order.

The set of memory access units 664 is coupled to the memory unit 670, which may include a data prefetcher 680, a data TLB unit 672, a data cache unit (DCU) 674, and a level 2 (L2) cache unit 676, to name a few examples. In some embodiments DCU 674 is also known as a first level data cache (L1 cache). The DCU 674 may handle multiple outstanding cache misses and continue to service incoming stores and loads. It also supports maintaining cache coherency. The data TLB unit 672 is a cache used to improve virtual address translation speed by mapping virtual and physical address spaces. In one exemplary embodiment, the memory access units 664 may include a load unit, a store address unit, and a store data unit, each of which is coupled to the data TLB unit 672 in the memory unit 670. The L2 cache unit 676 may be coupled to one or more other levels of cache and eventually to a main memory.

In one embodiment, the data prefetcher 680 speculatively loads/prefetches data to the DCU 674 by automatically predicting which data a program is about to consume. Prefetching may refer to transferring data stored in one memory location (e.g., position) of a memory hierarchy (e.g., lower level caches or memory) to a higher-level memory location that is closer (e.g., yields lower access latency) to the processor before the data is actually demanded by the processor. More specifically, prefetching may refer to the early retrieval of data from one of the lower level caches/memory to a data cache and/or prefetch buffer before the processor issues a demand for the specific data being returned.

The processor 600 may support one or more instructions sets (e.g., the x86 instruction set (with some extensions that have been added with newer versions); the MIPS instruction set of MIPS Technologies of Sunnyvale, Calif.; the ARM instruction set (with optional additional extensions such as NEON) of ARM Holdings of Sunnyvale, Calif.).

It should be understood that the core may support multi-threading (executing two or more parallel sets of operations or threads), and may do so in a variety of ways including time sliced multithreading, simultaneous multithreading (where a single physical core provides a logical core for each of the threads that physical core is simultaneously multi-threading), or a combination thereof (e.g., time sliced fetching and decoding and simultaneous multithreading thereafter such as in the Intel® Hyperthreading technology).

While register renaming is described in the context of out-of-order execution, it should be understood that register renaming may be used in an in-order architecture. While the illustrated embodiment of the processor also includes a separate instruction and data cache units and a shared L2 cache unit, alternative embodiments may have a single internal cache for both instructions and data, such as, for example, a Level 1 (L1) internal cache, or multiple levels of internal cache. In some embodiments, the system may include a combination of an internal cache and an external cache that is external to the core and/or the processor. Alternatively, all of the cache may be external to the core and/or the processor.

FIG. 6B is a block diagram illustrating an in-order pipeline and a register renaming stage, out-of-order issue/execution pipeline implemented by processing device 600 of FIG. 6A according to some embodiments of the disclosure. The solid lined boxes in FIG. 6B illustrate an in-order pipeline, while the dashed lined boxes illustrates a register renaming, out-of-order issue/execution pipeline. In FIG. 6B, a processor pipeline 600 includes a fetch stage 602, a length decode stage 604, a decode stage 606, an allocation stage 608, a renaming stage 610, a scheduling (also known as a dispatch or issue) stage 612, a register read/memory read stage 614, an execute stage 616, a write back/memory write stage 618, an exception handling stage 622, and a commit stage 624. In some embodiments, the ordering of stages 602-624 may be different than illustrated and are not limited to the specific ordering shown in FIG. 6B.

Figure 7:
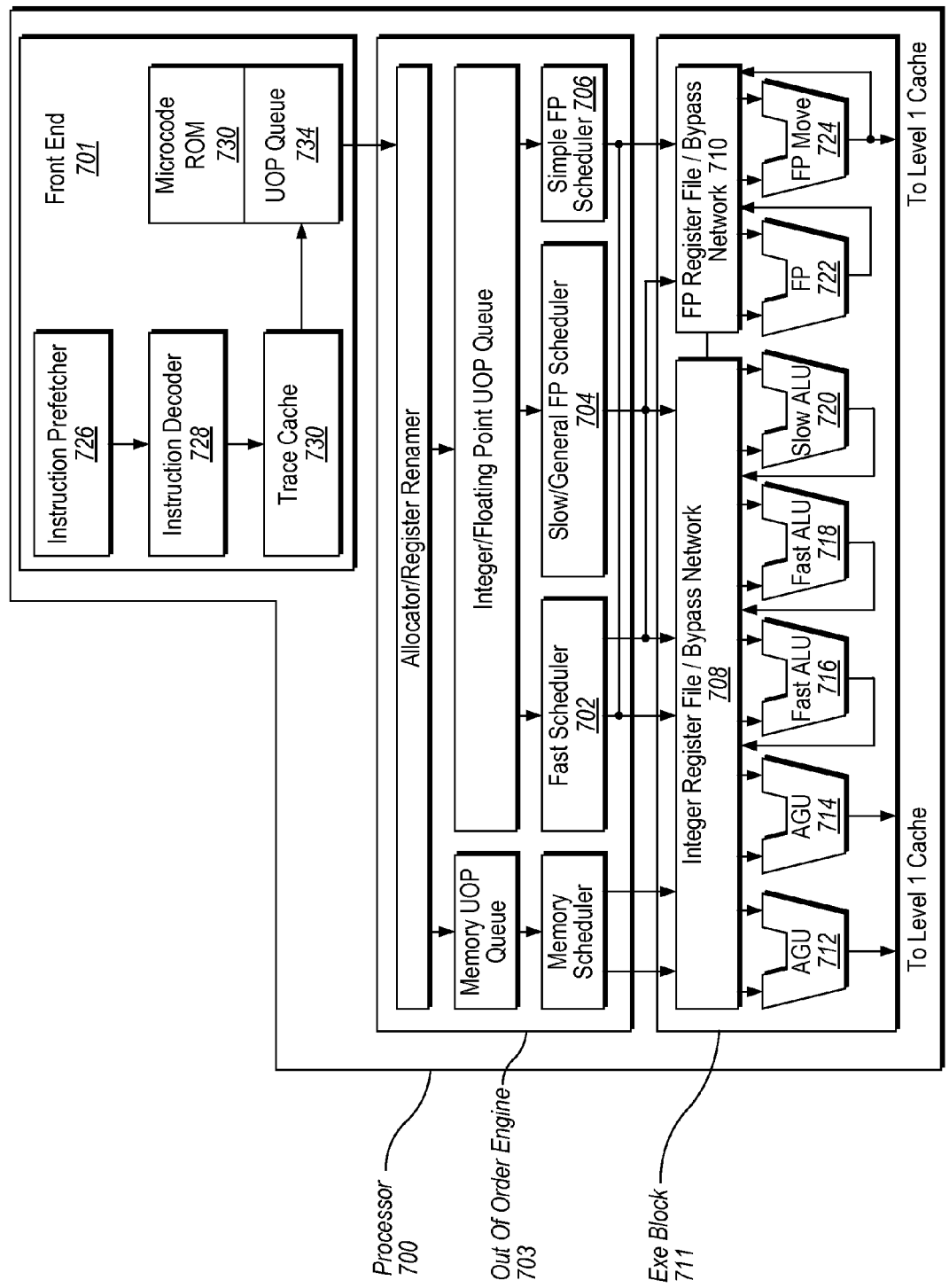
FIG. 7 illustrates a block diagram of the micro-architecture for a processor that includes logic circuits to perform dynamic heterogeneous hashing according to one embodiment.

FIG. 7 illustrates a block diagram of the micro-architecture for a processor 700 that includes logic circuits to perform dynamic heterogeneous hashing according to one embodiment. In some embodiments, an instruction in accordance with one embodiment can be implemented to operate on data elements having sizes of byte, word, doubleword, quadword, etc., as well as datatypes, such as single and double precision integer and floating point datatypes. In one embodiment the in-order front end 701 is the part of the processor 700 that fetches instructions to be executed and prepares them to be used later in the processor pipeline.

The front end 701 may include several units. In one embodiment, the instruction prefetcher 716 fetches instructions from memory and feeds them to an instruction decoder 718 which in turn decodes or interprets them. For example, in one embodiment, the decoder decodes a received instruction into one or more operations called "micro-instructions" or "micro-operations" (also called micro op or uops) that the machine can execute. In other embodiments, the decoder parses the instruction into an opcode and corresponding data and control fields that are used by the micro-architecture to perform operations in accordance with one embodiment. In one embodiment, the trace cache 730 takes decoded uops and assembles them into program ordered sequences or traces in the uop queue 734 for execution. When the trace cache 730 encounters a complex instruction, the microcode ROM 732 provides the uops needed to complete the operation.

Some instructions are converted into a single micro-op, whereas others need several micro-ops to complete the full operation. In one embodiment, if more than four micro-ops are needed to complete an instruction, the decoder 718 accesses the microcode ROM 732 to do the instruction. For one embodiment, an instruction can be decoded into a small number of micro ops for processing at the instruction decoder 718. In another embodiment, an instruction can be stored within the microcode ROM 732 should a number of micro-ops be needed to accomplish the operation. The trace cache 730 refers to an entry point programmable logic array (PLA) to determine a correct micro-instruction pointer for reading the micro-code sequences to complete one or more instructions in accordance with one embodiment from the micro-code ROM 732. After the microcode ROM 732 finishes sequencing micro-ops for an instruction, the front end 701 of the machine resumes fetching micro-ops from the trace cache 730.

The out-of-order execution engine 703 is where the instructions are prepared for execution. The out-of-order execution logic has a number of buffers to smooth out and reorder the flow of instructions to optimize performance as they go down the pipeline and get scheduled for execution. The allocator logic allocates the machine buffers and resources that each uop needs in order to execute. The register renaming logic renames logic registers onto entries in a register file. The allocator also allocates an entry for each uop in one of the two uop queues, one for memory operations and one for non-memory operations, in front of the instruction schedulers: memory scheduler, fast scheduler 702, slow/general floating point scheduler 704, and simple floating point scheduler 706. The uop schedulers 702, 704, 706, determine when a uop is ready to execute based on the readiness of their dependent input register operand sources and the availability of the execution resources the uops need to complete their operation. The fast scheduler 702 of one embodiment can schedule on each half of the main clock cycle while the other schedulers can only schedule once per main processor clock cycle. The schedulers arbitrate for the dispatch ports to schedule uops for execution.

Register files 708, 710, sit between the schedulers 702, 704, 706, and the execution units 712, 714, 716, 718, 710, 712, 714 in the execution block 711. There is a separate register file 708, 710, for integer and floating point operations, respectively. Each register file 708, 710, of one embodiment also includes a bypass network that can bypass or forward just completed results that have not yet been written into the register file to new dependent uops. The integer register file 708 and the floating point register file 710 are also capable of communicating data with the other. For one embodiment, the integer register file 708 is split into two separate register files, one register file for the low order 32 bits of data and a second register file for the high order 32 bits of data. The floating point register file 710 of one embodiment has 128 bit wide entries because floating point instructions typically have operands from 64 to 128 bits in width.

The execution block 711 contains the execution units 712, 714, 716, 718, 710, 712, 714, where the instructions are actually executed. This section includes the register files 708, 710, that store the integer and floating point data operand values that the micro-instructions need to execute. The processor 700 of one embodiment is comprised of a number of execution units: address generation unit (AGU) 712, AGU 714, fast ALU 716, fast ALU 718, slow ALU 710, floating point ALU 712, floating point move unit 714. For one embodiment, the floating point execution blocks 712, 714, execute floating point, MMX, SIMD, and SSE, or other operations. The floating point ALU 712 of one embodiment includes a 64 bit by 64 bit floating point divider to execute divide, square root, and remainder micro-ops. For embodiments of the present disclosure, instructions involving a floating point value may be handled with the floating point hardware.

In one embodiment, the ALU operations go to the high-speed ALU execution units 716, 718. The fast ALUs 716, 718, of one embodiment can execute fast operations with an effective latency of half a clock cycle. For one embodiment, most complex integer operations go to the slow ALU 710 as the slow ALU 710 includes integer execution hardware for long latency type of operations, such as a multiplier, shifts, flag logic, and branch processing. Memory load/store operations are executed by the AGUs 712, 714. For one embodiment, the integer ALUs 716, 718, 710, are described in the context of performing integer operations on 64 bit data operands. In alternative embodiments, the ALUs 716, 718, 710, can be implemented to support a variety of data bits including 16, 32, 128, 256, etc. Similarly, the floating point units 712, 714, can be implemented to support a range of operands having bits of various widths. For one embodiment, the floating point units 712, 714, can operate on 128 bits wide packed data operands in conjunction with SIMD and multimedia instructions.

In one embodiment, the uops schedulers 702, 704, 706, dispatch dependent operations before the parent load has finished executing. As uops are speculatively scheduled and executed in processor 700, the processor 700 also includes logic to handle memory misses. If a data load misses in the data cache, there can be dependent operations in flight in the pipeline that have left the scheduler with temporarily incorrect data. A replay mechanism tracks and re-executes instructions that use incorrect data. Only the dependent operations need to be replayed and the independent ones are allowed to complete. The schedulers and replay mechanism of one embodiment of a processor are also designed to catch instruction sequences for text string comparison operations.

The processor 700 also includes logic to implement dynamic heterogeneous hashing according to one embodiment. In one embodiment, the execution block 711 of processor 700 may include MCU 115, to perform dynamic heterogeneous hashing according to the description herein.

The term "registers" may refer to the on-board processor storage locations that are used as part of instructions to identify operands. In other words, registers may be those that are usable from the outside of the processor (from a programmer's perspective). However, the registers of an embodiment should not be limited in meaning to a particular type of circuit. Rather, a register of an embodiment is capable of storing and providing data, and performing the functions described herein. The registers described herein can be implemented by circuitry within a processor using any number of different techniques, such as dedicated physical registers, dynamically allocated physical registers using register renaming, combinations of dedicated and dynamically allocated physical registers, etc. In one embodiment, integer registers store thirty-two bit integer data. A register file of one embodiment also contains eight multimedia SIMD registers for packed data.

For the discussions herein, the registers are understood to be data registers designed to hold packed data, such as 64 bits wide MMX™ registers (also referred to as 'mm' registers in some instances) in microprocessors enabled with MMX technology from Intel Corporation of Santa Clara, Calif. These MMX registers, available in both integer and floating point forms, can operate with packed data elements that accompany SIMD and SSE instructions. Similarly, 128 bits wide XMM registers relating to SSE2, SSE3, SSE4, or beyond (referred to generically as "SSEx") technology can also be used to hold such packed data operands. In one embodiment, in storing packed data and integer data, the registers do not need to differentiate between the two data types. In one embodiment, integer and floating point are either contained in the same register file or different register files. Furthermore, in one embodiment, floating point and integer data may be stored in different registers or the same registers.

Figure 8:
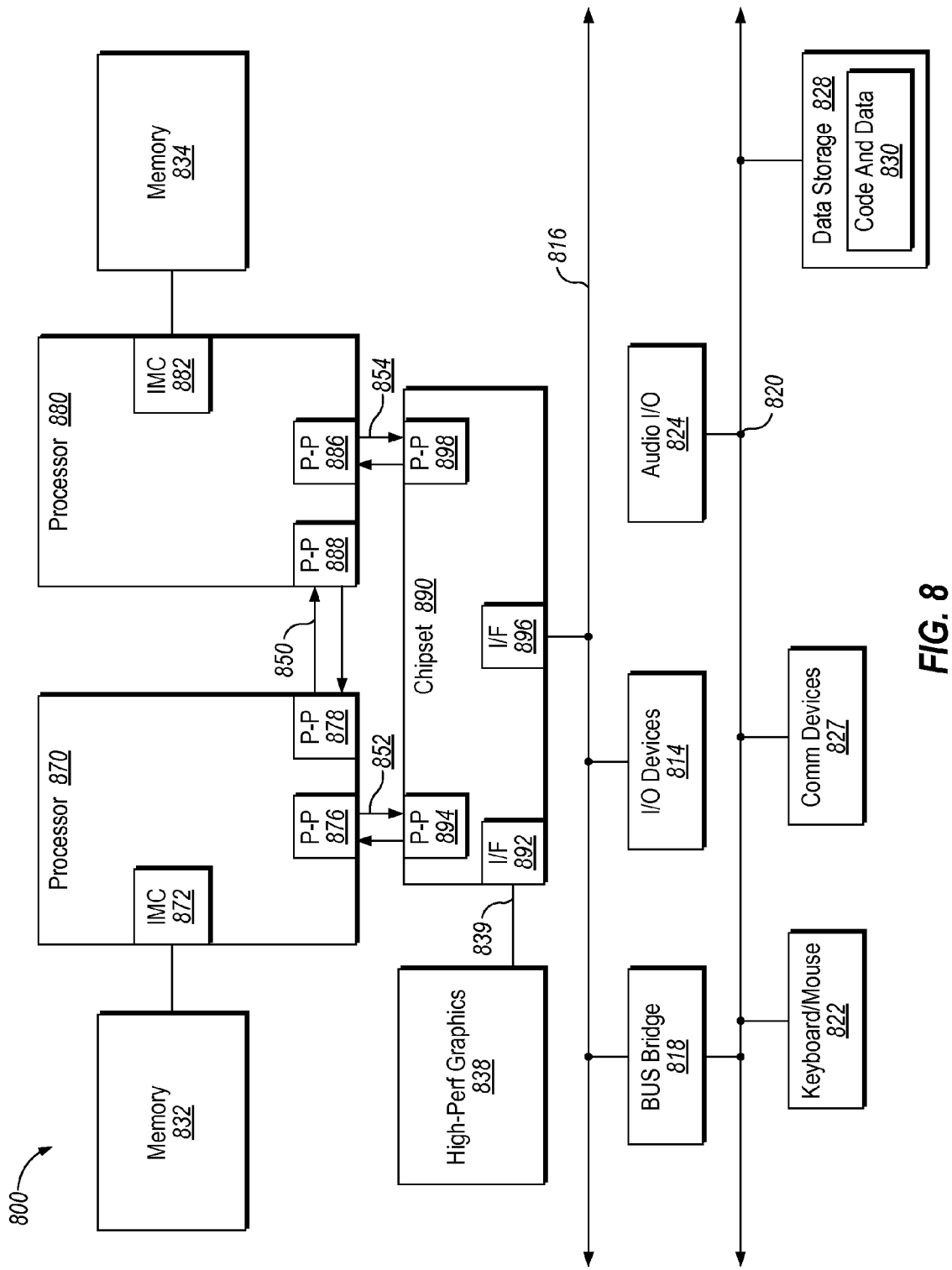
FIG. 8 is a block diagram of a computer system according to one implementation.

Embodiments may be implemented in many different system types. Referring now to FIG. 8, shown is a block diagram of a multiprocessor system 800 in accordance with an implementation. As shown in FIG. 8, multiprocessor system 800 is a point-to-point interconnect system, and includes a first processor 870 and a second processor 880 coupled via a point-to-point interconnect 850. As shown in FIG. 8, each of processors 870 and 880 may be multicore processors, including first and second processor cores (i.e., processor cores 874*a* and 874*b* and processor cores 884*a* and 884*b*), although potentially many more cores may be present in the processors. The processors each may include write mode logics in accordance with an embodiment of the present.

While shown with two processors 870, 880, it is to be understood that the scope of the present disclosure is not so limited. In other implementations, one or more additional processors may be present in a given processor.

Processors 870 and 880 are shown including integrated memory controller units 882 and 882, respectively. Processor 870 also includes as part of its bus controller units point-to-point (P-P) interfaces 876 and 888; similarly, second processor 880 includes P-P interfaces 886 and 888. Processors 870, 880 may exchange information via a point-to-point (P-P) interface 850 using P-P interface circuits 888, 888. As shown in FIG. 8, IMCs 882 and 882 couple the processors to respective memories, namely a memory 832 and a memory 834, which may be portions of main memory locally attached to the respective processors.

Processors 870, 880 may each exchange information with a chipset 890 via individual P-P interfaces 852, 854 using point to point interface circuits 876, 894, 886, 898. Chipset 890 may also exchange information with a high-performance graphics circuit 838 via a high-performance graphics interface 839.

A shared cache (not shown) may be included in either processor or outside of both processors, yet connected with the processors via P-P interconnect, such that either or both processors' local cache information may be stored in the shared cache if a processor is placed into a low power mode.

Chipset 890 may be coupled to a first bus 816 via an interface 896. In one embodiment, first bus 816 may be a Peripheral Component Interconnect (PCI) bus, or a bus such as a PCI Express bus or another third generation I/O interconnect bus, although the scope of the present disclosure is not so limited.

As shown in FIG. 8, various I/O devices 814 may be coupled to first bus 816, along with a bus bridge 818 which couples first bus 816 to a second bus 820. In one embodiment, second bus 820 may be a low pin count (LPC) bus. Various devices may be coupled to second bus 820 including, for example, a keyboard and/or mouse 822, communication devices 827 and a storage unit 828 such as a disk drive or other mass storage device which may include instructions/code and data 830, in one embodiment. Further, an audio I/O 824 may be coupled to second bus 820. Note that other architectures are possible. For example, instead of the point-to-point architecture of FIG. 8, a system may implement a multi-drop bus or other such architecture.

Figure 9:
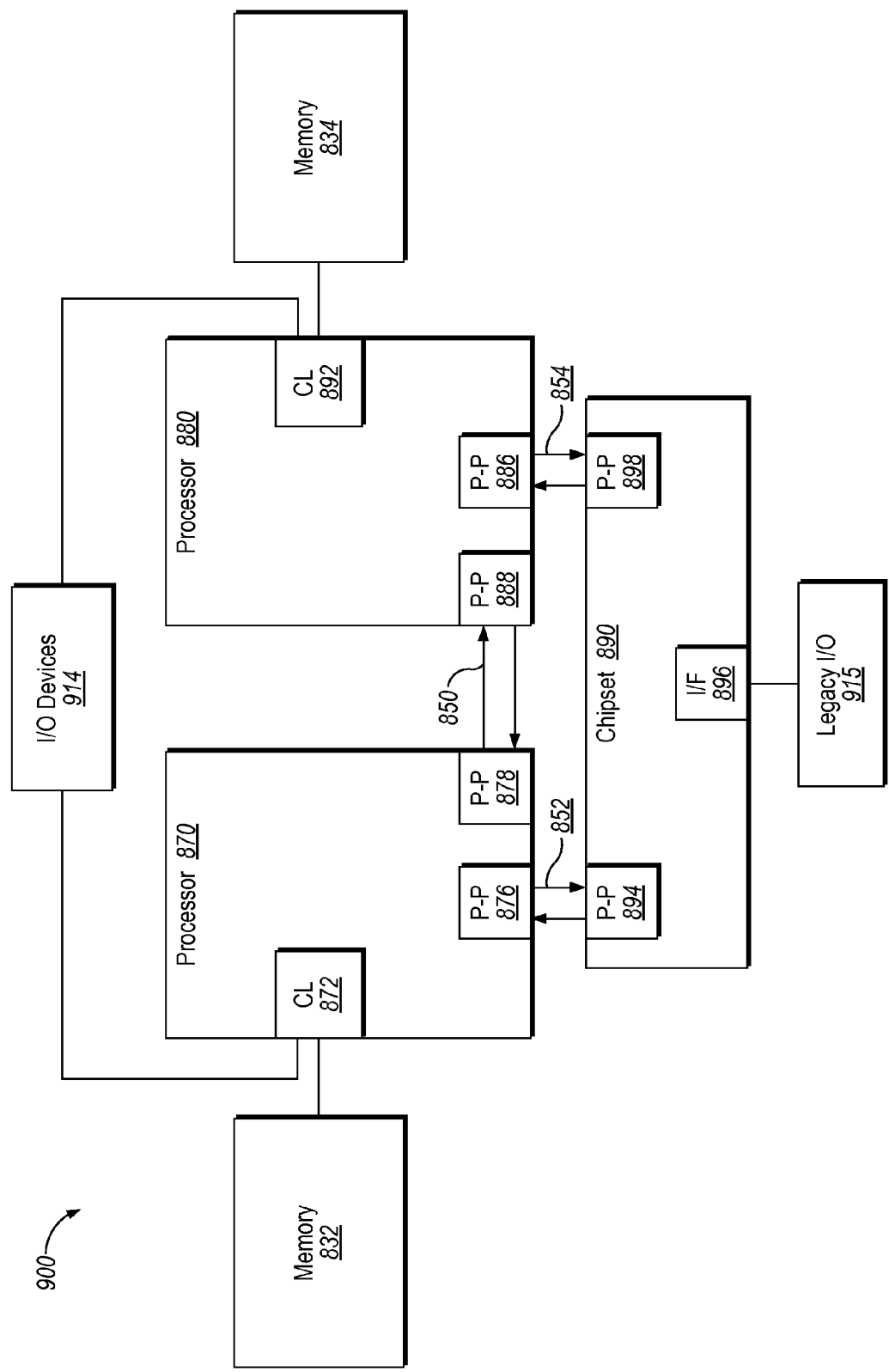
FIG. 9 is a block diagram of a computer system according to another implementation.

Referring now to FIG. 9, shown is a block diagram of a third system 900 in accordance with an embodiment of the present invention. Like elements in FIGS. 8 and 9 bear like reference numerals, and certain aspects of FIG. 8 have been omitted from FIG. 9 in order to avoid obscuring other aspects of FIG. 9.

FIG. 9 illustrates that the processors 970, 980 may include integrated memory and I/O control logic ("CL") 972 and 982, respectively. For at least one embodiment, the CL 972, 982 may include integrated memory controller units such as described herein. In addition. CL 972, 982 may also include I/O control logic. FIG. 9 illustrates that the memories 932, 934 are coupled to the CL 972, 982, and that I/O devices 914 are also coupled to the control logic 972, 982. Legacy I/O devices 915 are coupled to the chipset 990.

Figure 10:
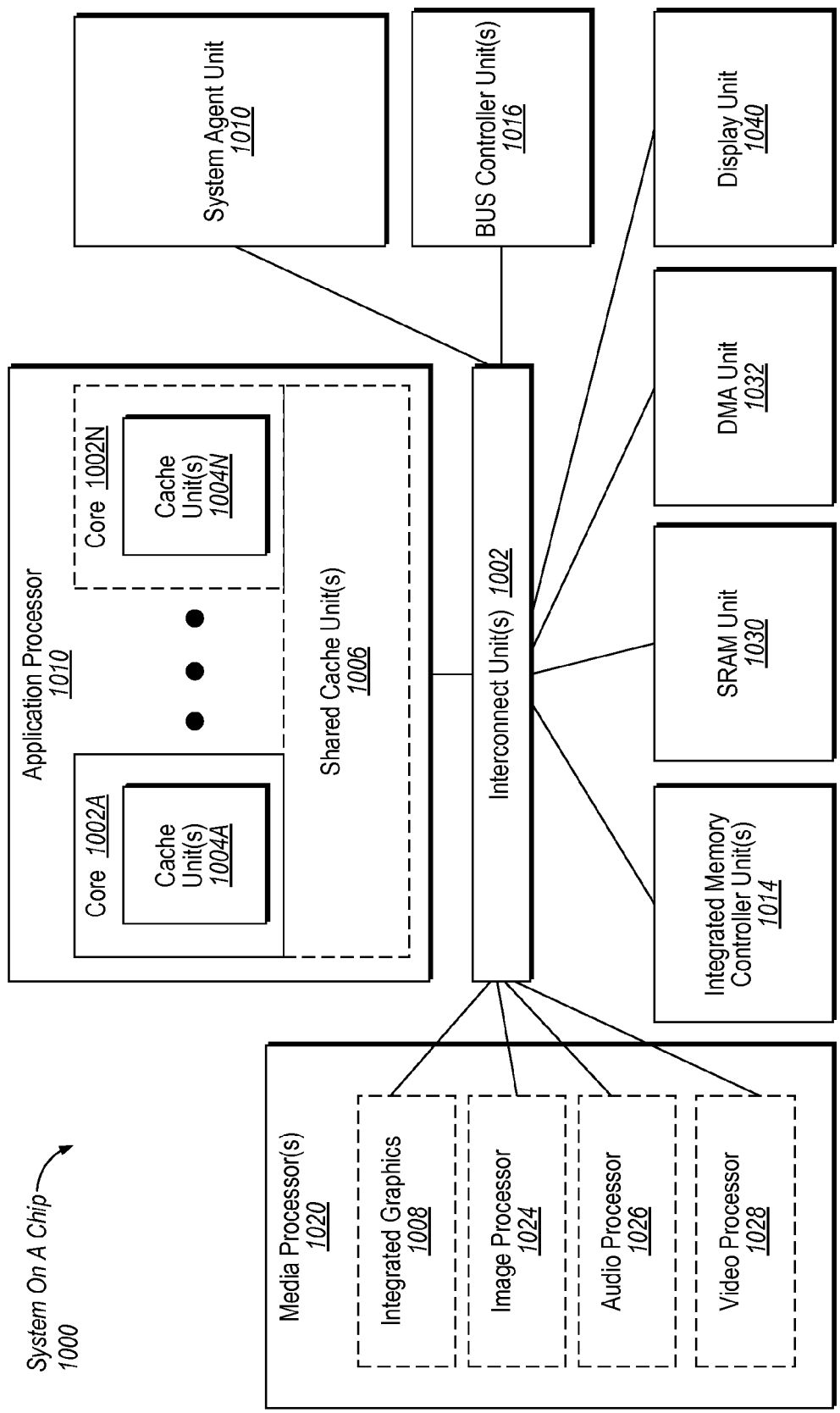
FIG. 10 is a block diagram of a system-on-a-chip according to one implementation.

FIG. 10 is an exemplary system on a chip (SoC) that may include one or more of the cores 1002. Other system designs and configurations known in the arts for laptops, desktops, handheld PCs, personal digital assistants, engineering workstations, servers, network devices, network hubs, switches, embedded processors, digital signal processors (DSPs), graphics devices, video game devices, set-top boxes, micro controllers, cell phones, portable media players, hand held devices, and various other electronic devices, are also suitable. In general, a huge variety of systems or electronic devices capable of incorporating a processor and/or other execution logic as disclosed herein are generally suitable.

Referring now to FIG. 10, shown is a block diagram of a SoC 1000 in accordance with an embodiment of the present disclosure. Similar elements in FIG. 5 bear like reference numerals. Also, dashed lined boxes are features on more advanced SoCs. In FIG. 10, an interconnect unit(s) 1002 is coupled to: an application processor 1010 which includes a set of one or more cores 1002A-N and shared cache unit(s) 1006; a system agent unit 1010; a bus controller unit(s) 1016; an integrated memory controller unit(s) 1014; a set or one or more media processors 1020 which may include integrated graphics logic 1008, an image processor 1024 for providing still and/or video camera functionality, an audio processor 1026 for providing hardware audio acceleration, and a video processor 1028 for providing video encode/decode acceleration; a static random access memory (SRAM) unit 1030; a direct memory access (DMA) unit 1032; and a display unit 1040 for coupling to one or more external displays.

Figure 11:
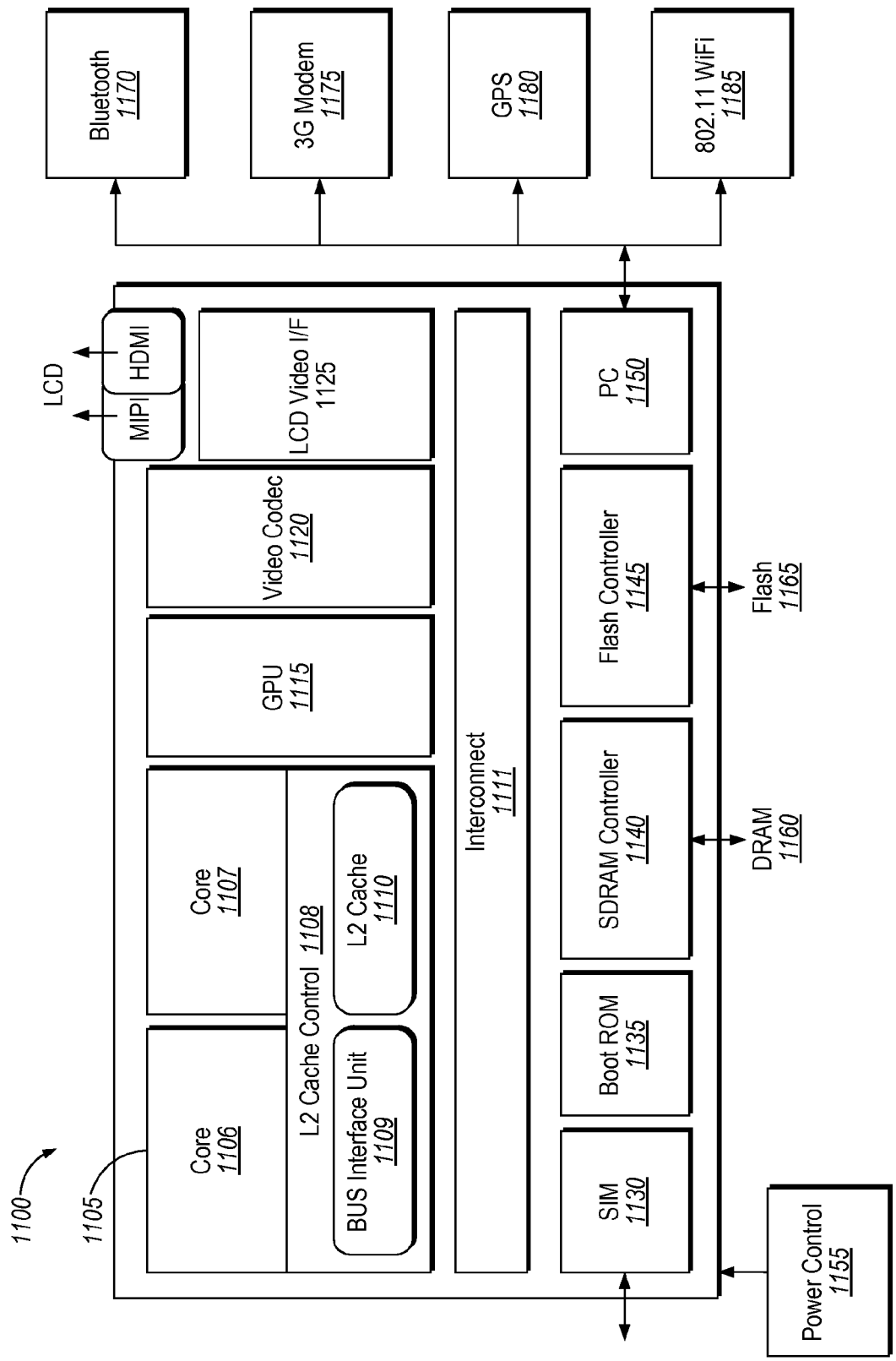
FIG. 11 illustrates another implementation of a block diagram for a computing system.

Turning next to FIG. 11, an embodiment of a system on-chip (SoC) design in accordance with embodiments of the disclosure is depicted. As an illustrative example, SoC 1100 is included in user equipment (UE). In one embodiment, UE refers to any device to be used by an end-user to communicate, such as a hand-held phone, smartphone, tablet, ultra-thin notebook, notebook with broadband adapter, or any other similar communication device. A UE may connect to a base station or node, which can correspond in nature to a mobile station (MS) in a GSM network.

Here, SoC 1100 includes 2 cores—1106 and 1107. Similar to the discussion above, cores 1106 and 1107 may conform to an Instruction Set Architecture, such as a processor having the Intel® Architecture Core™, an Advanced Micro Devices, Inc. (AMD) processor, a MIPS-based processor, an ARM-based processor design, or a customer thereof, as well as their licensees or adopters. Cores 1106 and 1107 are coupled to cache control 1108 that is associated with bus interface unit 1109 and L2 cache 1110 to communicate with other parts of system 1100. Interconnect 1111 includes an on-chip interconnect, such as an IOSF, AMBA, or other interconnects discussed above, which can implement one or more aspects of the described disclosure.

Interconnect 1111 provides communication channels to the other components, such as a Subscriber Identity Module (SIM) 1130 to interface with a SIM card, a boot ROM 1135 to hold boot code for execution by cores 1106 and 1107 to initialize and boot SoC 1100, a SDRAM controller 1140 to interface with external memory (e.g. DRAM 1160), a flash controller 1145 to interface with non-volatile memory (e.g. Flash 1165), a peripheral control 1150 (e.g. Serial Peripheral Interface) to interface with peripherals, video codecs 1120 and Video interface 1125 to display and receive input (e.g. touch enabled input), GPU 1115 to perform graphics related computations, etc. Any of these interfaces may incorporate aspects of the embodiments described herein.

In addition, the system illustrates peripherals for communication, such as a Bluetooth module 1170, 3G modem 1175, GPS 1180, and Wi-Fi 1185. Note as stated above, a UE includes a radio for communication. As a result, these peripheral communication modules may not all be included. However, in a UE some form of a radio for external communication should be included.

Figure 12:
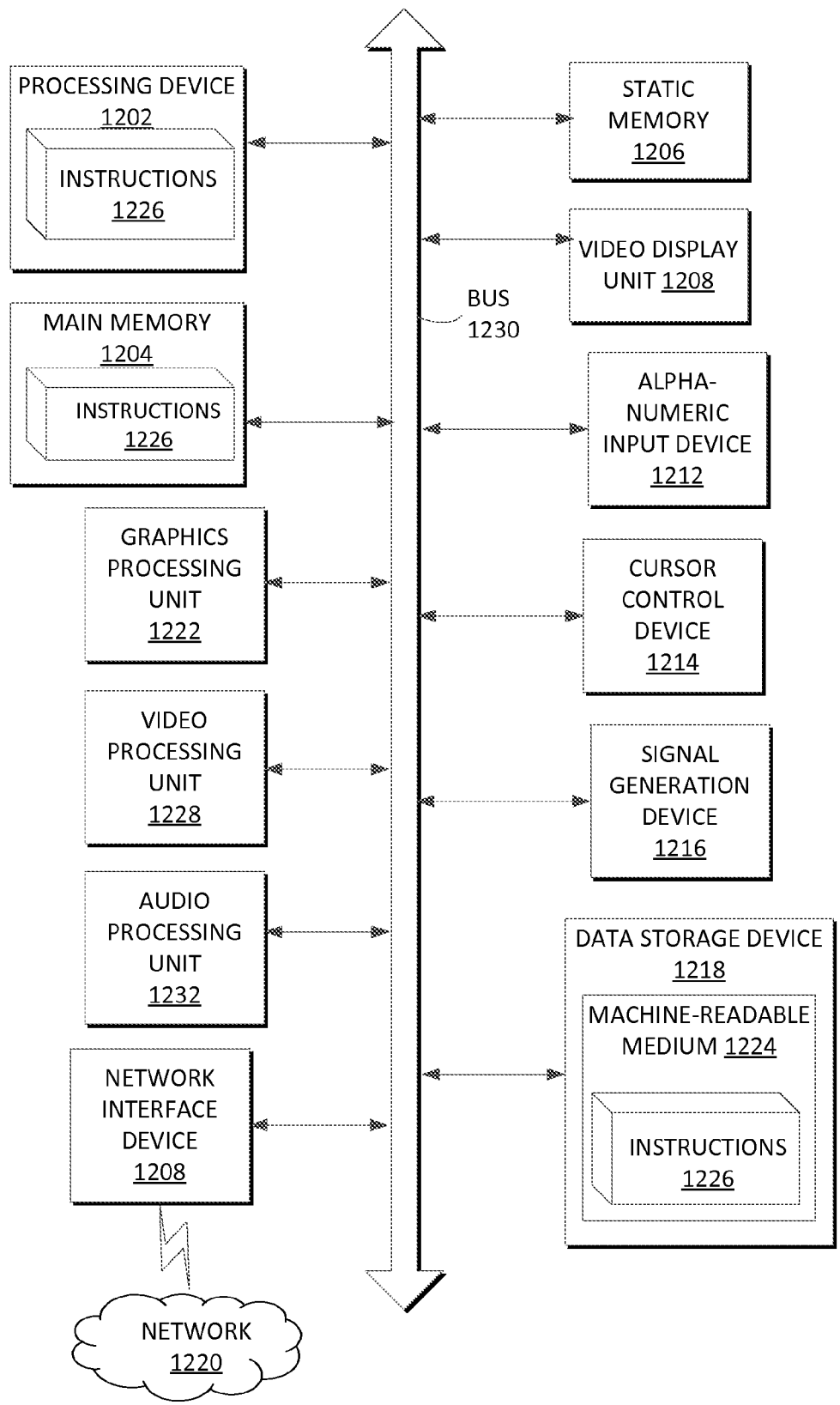
FIG. 12 illustrates another implementation of a block diagram for a computing system.

FIG. 12 illustrates a diagrammatic representation of a machine in the example form of a computing system 1200 within which a set of instructions, for causing the machine to perform any one or more of the methodologies discussed herein, may be executed. In alternative embodiments, the machine may be connected (e.g., networked) to other machines in a LAN, an intranet, an extranet, or the Internet. The machine may operate in the capacity of a server or a client device in a client-server network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein.

The computing system 1200 includes a processing device 1202, main memory 1204 (e.g., read-only memory (ROM), flash memory, dynamic random access memory (DRAM) (such as synchronous DRAM (SDRAM) or DRAM (RDRAM), etc.), a static memory 1206 (e.g., flash memory, static random access memory (SRAM), etc.), and a data storage device 1218, which communicate with each other via a bus 1230.

Processing device 1202 represents one or more general-purpose processing devices such as a microprocessor, central processing unit, or the like. More particularly, the processing device may be complex instruction set computing (CISC) microprocessor, reduced instruction set computer (RISC) microprocessor, very long instruction word (VLIW) microprocessor, or processor implementing other instruction sets, or processors implementing a combination of instruction sets. Processing device 1202 may also be one or more special-purpose processing devices such as an application specific integrated circuit (ASIC), a field programmable gate array (FPGA), a digital signal processor (DSP), network processor, or the like. In one embodiment, processing device 1202 may include one or processing cores. The processing device 1202 is configured to execute the processing logic 1226 for performing the operations discussed herein. In one embodiment, processing device 1202 can be part of the computing system 100 of FIG. 1. Alternatively, the computing system 1200 can include other components as described herein. It should be understood that the core may support multithreading (executing two or more parallel sets of operations or threads), and may do so in a variety of ways including time sliced multithreading, simultaneous multithreading (where a single physical core provides a logical core for each of the threads that physical core is simultaneously multithreading), or a combination thereof (e.g., time sliced fetching and decoding and simultaneous multithreading thereafter such as in the Intel® Hyperthreading technology).

The computing system 1200 may further include a network interface device 1208 communicably coupled to a network 1220. The computing system 1200 also may include a video display unit 1210 (e.g., a liquid crystal display (LCD) or a cathode ray tube (CRT)), an alphanumeric input device 1212 (e.g., a keyboard), a cursor control device 1214 (e.g., a mouse), a signal generation device 1216 (e.g., a speaker), or other peripheral devices. Furthermore, computing system 1200 may include a graphics processing unit 1222, a video processing unit 1228 and an audio processing unit 1232. In another embodiment, the computing system 1200 may include a chipset (not illustrated), which refers to a group of integrated circuits, or chips, that are designed to work with the processing device 1202 and controls communications between the processing device 1202 and external devices. For example, the chipset may be a set of chips on a motherboard that links the processing device 1202 to very high-speed devices, such as main memory 1204 and graphic controllers, as well as linking the processing device 1202 to lower-speed peripheral buses of peripherals, such as USB, PCI or ISA buses.

The data storage device 1218 may include a computer-readable storage medium 1224 on which is stored software 1226 embodying any one or more of the methodologies of functions described herein. The software 1226 may also reside, completely or at least partially, within the main memory 1204 as instructions 1226 and/or within the processing device 1202 as processing logic 1226 during execution thereof by the computing system 1200; the main memory 1204 and the processing device 1202 also constituting computer-readable storage media.

The computer-readable storage medium 1224 may also be used to store instructions 1226 utilizing the processing device 1202, such as described with respect to FIG. 1, and/or a software library containing methods that call the above applications. While the computer-readable storage medium 1224 is shown in an example embodiment to be a single medium, the term "computer-readable storage medium" should be taken to include a single medium or multiple media (e.g., a centralized or distributed database, and/or associated caches and servers) that store the one or more sets of instructions. The term "computer-readable storage medium" shall also be taken to include any medium that is capable of storing, encoding or carrying a set of instruction for execution by the machine and that cause the machine to perform any one or more of the methodologies of the present embodiments. The term "computer-readable storage medium" shall accordingly be taken to include, but not be limited to, solid-state memories, and optical and magnetic media.

The following examples pertain to further embodiments.

In Example 1, a processor comprises: a first memory interface coupled to a first memory device that is located off-package of the processor; a second memory interface coupled to a second memory device that is located off-package of the processor; and a multi-level memory controller (MLMC) coupled to the first memory interface and the second memory interface, wherein the MLMC comprises a first configuration and a second configuration, wherein the first memory device is a random access memory (RAM) of a one-level memory (1LM) architecture in the first configuration, wherein the first memory device is a first-level RAM of a two-level memory (2LM) architecture in the second configuration and the second memory device is a second-level non-volatile memory (NVM) of the 2LM architecture in the second configuration.

In Example 2, the subject matter of Example 1 the MLMC comprises: a 2LM cache controller; a near memory (NM) controller coupled to the first memory interface; a far memory (FM) controller coupled to the second memory interface and the 2LM cache controller; a system agent arbiter coupled to a requesting unit and the 2LM cache controller; and a multiplexer comprising a first input coupled to an output of the 2LM cache controller, a second input coupled to an output of the system agent arbiter, and an output coupled to the NM controller, wherein the multiplexer is to select between the first input and the second output based on an indicator that specifies the first configuration or the second configuration.

In Example 3, the subject matter of any one of Examples 1-2 the first memory interface is a double data rate (DDR) memory interface.

In Example 4, the subject matter of any one of Examples 1-3 the second memory interface is an expansion card interface.

In Example 5, the subject matter of any one of Examples 1-4 the second memory interface is at least one of a M.2 standard interface.

In Example 6, the subject matter of any one of Examples 1-5 the first memory device comprises double data rate (DDR) dynamic random access memory (DRAM).

In Example 7, the subject matter of any one of Examples 1-6 the DDR DRAM is at least one of DDR3 DRAM, DDR3L or DDR4 DRAM in the first configuration and is low power DDR4 (LPDDR4) DRAM in the second configuration.

In Example 8, the subject matter of any one of Examples 1-7 the second memory interface comprises a plurality of pins for a direct connection between the processor and the second memory device.

In Example 9, the subject matter of any one of Examples 1-8, in the second configuration, the MLMC is to interact with the first memory device as near memory in the 2LM architecture and with the second memory device as far memory in the 2LM architecture.

Various embodiments may have different combinations of the structural features described above. For instance, all optional features of the processor described above may also be implemented with respect to a system on chip (SoC) described herein and specifics in the examples may be used anywhere in one or more embodiments.

In Example 10, a system on chip (SoC) comprises: a plurality of functional units; and a multi-level memory controller (MLMC) to provide a common platform for a one-level memory (1LM) configuration and a two-level memory (2LM) configuration, wherein the MLMC comprises: a 2LM cache controller; a near memory (NM) controller coupled to a first memory interface to communicate with a first memory device that is located off-package of the SoC; a far memory (FM) controller coupled to a second memory interface and the 2LM cache controller, the second memory interface to communicate with a second memory device that is located off-package of the SoC; a system agent arbiter coupled to the plurality of functional units and the 2LM cache controller; and a multiplexer comprising a first input coupled to an output of the 2LM cache controller, a second input coupled to an output of the system agent arbiter, and an output coupled to the NM controller, wherein the multiplexer is to select between the first input and the second output based on an indicator that specifies the 1LM configuration or the 2LM configuration.

In Example 11, the subject matter of Example 10 the first memory interface is a double data rate (DDR) memory interface and the second memory interface is an expansion card interface.

In Example 12, the subject matter of any one of Examples 10-11 the DDR memory interface is to interact with at least one of DDR3 dynamic random access memory (DRAM), DDR3L or DDR4 DRAM in the 1LM configuration and low power DDR4 (LPDDR4) DRAM in the 2LM configuration.

In Example 13, the subject matter of any one of Examples 10-12 the second memory interface comprises a plurality of pins for a direct connection between the second memory device and the SoC.

In Example 14, the subject matter of any one of Examples 10-13 the first memory device is random access memory (RAM) in the 1LM configuration and the first memory device is near memory in the 2LM configuration, and wherein the second memory device is far memory in the 2LM configuration.

Various embodiments may have different combinations of the structural features described above. For instance, all optional features of the computing system described above may also be implemented with respect to the method or process described herein and specifics in the examples may be used anywhere in one or more embodiments.

In Example 15, a method comprises: determining, by a processor, whether a second memory device is present in a computer platform comprising the processor; and when the second memory device is not present, presenting to software, by a multi-level memory controller (MLMC) of the processor, a first addressable memory space of system memory based on a first capacity of a first memory device present in the computer platform in a one-level memory (1LM) configuration mode; and when the second memory device is present, setting the first memory device as near memory (NM) in a two-level memory (2LM) configuration mode, setting at least a portion of the second memory device as far memory (FM) in the 2LM configuration mode, and presenting to the software, by the MLMC, a second addressable memory space of system memory based on a size of the portion in the 2LM configuration mode.

In Example 16, the subject matter of any one of Example 15 further comprises: determining whether the 2LM configuration mode is enabled; and when the 2LM configuration mode is not enabled, presenting to software, by the MLMC, the first addressable memory space of system memory based on the first capacity of the first memory device in the 1LM configuration mode, and when the 2LM configuration mode is enabled, performing the setting the first memory device as the near memory, the setting at least the portion of the second memory as the far memory and presenting to the software the second addressable memory space.

In Example 17, the subject matter of any one of Examples 15-16, further comprises: when the when the second memory device is present, determining, by the processor, a second capacity of the first memory device present; and determining, by the processor, a configuration of the first memory device.

In Example 18, the subject matter of any one of Examples 15-17 the determining the second capacity comprises reading a DDR capacity of the first memory device and setting a size of the NM for a 2LM controller of the MLMC.

In Example 19, the subject matter of any one of Examples 15-18 further comprises: receiving a memory request for a memory page at a system agent arbiter of the MLMC; when in the 1LM configuration, sending the memory request to a first memory controller of the MLMC, the first memory controller coupled to the first memory device; when in the 2LM configuration, sending the memory request to a 2LM cache controller of the MLMC; and determining, by the 2LM controller, whether an address of the memory request is located in NM, wherein the memory request is sent to the first memory controller when the address is in the NM and the memory request is sent to a FM controller when the address is not in the NM, the FM controller coupled to the second memory device.

In Example 20, the subject matter of any one of Examples 15-19 further comprises allocating the memory page in NM when the address is not in the NM.

Various embodiments may have different combinations of the structural features described above. For instance, all optional features of the SoC described above may also be implemented with respect to a processor described herein and specifics in the examples may be used anywhere in one or more embodiments.

Example 21 is a computer platform comprising: a central processing unit (CPU) die and package; and a circuit board comprising a CPU socket in which the CPU die and package is connected, a first memory socket in which a first memory device is connected to the CPU die and package, and a second memory socket in which a second memory device is connected to the CPU die and package, wherein the CPU die and package comprises: a processor; a first memory interface coupled to the first memory socket; a second memory interface coupled to the second memory socket; and a multi-level memory controller (MLMC) coupled to the first memory interface and the second memory interface, wherein the MLMC comprises a one-level memory (1LM) configuration and a two-level memory (2LM) configuration for the computer platform, wherein the MLMC is to interact with the first memory device as near memory in the 2LM configuration and with the second memory device as far memory in the 2LM architecture.

In Example 22, the subject matter of Example 21 the second memory device is a non-volatile memory (NVM) in the 2LM configuration, wherein the first memory device is at least one of double data rate 3 (DDR3) dynamic random access memory (DRAM) or DDR4 DRAM in the 1LM configuration and the first memory device is low power DDR4 (LPDDR) in the 2LM configuration.

In Example 23, the subject matter of any of Examples 21-22 the first memory socket is a dual in-line memory module (DIMM) socket and the second memory socket is an expansion card socket.

In Example 24, the subject matter of any of Examples 21-23 the first memory device is at least one of a small outline DIMM (SoDIMM) or an unbuffered DIMM (UDIMM).

In Example 25, the subject matter of any of Examples 21-24 the MLMC comprises: a 2LM cache controller; a near memory (NM) controller coupled to the first memory interface; a far memory (FM) controller coupled to the second memory interface and the 2LM cache controller; a system agent arbiter coupled to a requesting unit and the 2LM cache controller; and a multiplexer comprising a first input coupled to an output of the 2LM cache controller, a second input coupled to an output of the system agent arbiter, and an output coupled to the NM controller, wherein the multiplexer is to select between the first input and the second output based on an indicator that specifies the 1LM configuration or the 2LM configuration.

Various embodiments may have different combinations of the operational features described above. For instance, all optional features of the method described above may also be implemented with respect to a non-transitory, computer-readable storage medium. Specifics in the examples may be used anywhere in one or more embodiments.

Example 26 is a non-transitory, computer-readable storage medium including instructions that, when executed by a processor, cause the processor to perform the method of Examples 15-20.

Example 27 is a system comprising a system on chip (SoC) comprising a plurality of functional units and a multi-level memory controller (MLMC) coupled to the plurality of functional units, wherein the MLMC is configured to perform the method of any of Examples 15-20.

In Example 28, the system of Example 27, the SoC further comprises the subject matter of any of Examples 1-14 and 21-25.

Example 29 is an apparatus comprising: a plurality of functional units of a processor; means for determining whether a second memory device is present in a computer platform; and when the second memory device is not present, means for presenting to software, by a multi-level memory controller (MLMC) of the processor, a first addressable memory space of system memory based on a first capacity of a first memory device present in the computer platform in a one-level memory (1LM) configuration mode; and when the second memory device is present, means for setting the first memory device as near memory (NM) in a two-level memory (2LM) configuration mode, means for setting at least a portion of the second system device as far memory (FM) in the 2LM configuration mode, and means for presenting to the software, by the MLMC, a second addressable memory space of system memory based on a size of the portion in the 2LM configuration mode.

In Example 30, the apparatus of Example 29 further comprises the subject matter of any of Examples 1-14 and 21-25.

Example 31 is an apparatus comprising: a memory device and a processor comprising a multi-level memory controller (MLMC), wherein the processor is configured to perform the method of any of Examples 15-20.

In Example 32, the apparatus of Example 31 further comprises the subject matter of any of Examples 1-14 and 21-25.

In the above description, numerous details are set forth. It will be apparent, however, to one of ordinary skill in the art having the benefit of this disclosure, that embodiments may be practiced without these specific details. In some instances, well-known structures and devices are shown in block diagram form, rather than in detail, in order to avoid obscuring the description.

Some portions of the detailed description are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here and generally, conceived to be a self-consistent sequence of operations leading to a desired result. The operations are those requiring physical manipulations of physical quantities. Usually, though not necessarily, these quantities take the form of electrical or magnetic signals capable of being stored, transferred, combined, compared and otherwise manipulated. It has proven convenient at times, principally for reasons of common usage, to refer to these signals as bits, values, elements, symbols, characters, terms, numbers or the like. The blocks described herein can be hardware, software, firmware or a combination thereof.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as "encrypting," "decrypting," "storing," "providing," "deriving," "obtaining," "receiving," "authenticating," "deleting," "executing," "requesting," "communicating," or the like, refer to the actions and processes of a computing system, or similar electronic computing device, that manipulates and transforms data represented as physical (e.g., electronic) quantities within the computing system's registers and memories into other data similarly represented as physical quantities within the computing system memories or registers or other such information storage, transmission or display devices.

The words "example" or "exemplary" are used herein to mean serving as an example, instance or illustration. Any aspect or design described herein as "example" or "exemplary" is not necessarily to be construed as preferred or advantageous over other aspects or designs. Rather, use of the words "example" or "exemplary" is intended to present concepts in a concrete fashion. As used in this application, the term "or" is intended to mean an inclusive "or" rather than an exclusive "or." That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims should generally be construed to mean "one or more" unless specified otherwise or clear from context to be directed to a singular form. Moreover, use of the term "an embodiment" or "one embodiment" or "an implementation" or "one implementation" throughout is not intended to mean the same embodiment or implementation unless described as such. Also, the terms "first," "second," "third," "fourth," etc. as used herein are meant as labels to distinguish among different elements and may not necessarily have an ordinal meaning according to their numerical designation.

Embodiments descried herein may also relate to an apparatus for performing the operations herein. This apparatus may be specially constructed for the required purposes, or it may comprise a general-purpose computer selectively activated or reconfigured by a computer program stored in the computer. Such a computer program may be stored in a non-transitory computer-readable storage medium, such as, but not limited to, any type of disk including floppy disks, optical disks, CD-ROMs and magnetic-optical disks, read-only memories (ROMs), random access memories (RAMs), EPROMs, EEPROMs, magnetic or optical cards, flash memory, or any type of media suitable for storing electronic instructions. The term "computer-readable storage medium" should be taken to include a single medium or multiple media (e.g., a centralized or distributed database and/or associated caches and servers) that store the one or more sets of instructions. The term "computer-readable medium" shall also be taken to include any medium that is capable of storing, encoding or carrying a set of instructions for execution by the machine and that causes the machine to perform any one or more of the methodologies of the present embodiments. The term "computer-readable storage medium" shall accordingly be taken to include, but not be limited to, solid-state memories, optical media, magnetic media, any medium that is capable of storing a set of instructions for execution by the machine and that causes the machine to perform any one or more of the methodologies of the present embodiments.

The algorithms and displays presented herein are not inherently related to any particular computer or other apparatus. Various general-purpose systems may be used with programs in accordance with the teachings herein, or it may prove convenient to construct a more specialized apparatus to perform the operations. The required structure for a variety of these systems will appear from the description below. In addition, the present embodiments are not described with reference to any particular programming language. It will be appreciated that a variety of programming languages may be used to implement the teachings of the embodiments as described herein.

The above description sets forth numerous specific details such as examples of specific systems, components, methods and so forth, in order to provide a good understanding of several embodiments. It will be apparent to one skilled in the art, however, that at least some embodiments may be practiced without these specific details. In other instances, well-known components or methods are not described in detail or are presented in simple block diagram format in order to avoid unnecessarily obscuring the present embodiments. Thus, the specific details set forth above are merely exemplary. Particular implementations may vary from these exemplary details and still be contemplated to be within the scope of the present embodiments.

It is to be understood that the above description is intended to be illustrative and not restrictive. Many other embodiments will be apparent to those of skill in the art upon reading and understanding the above description. The scope of the present embodiments should, therefore, be determined with reference to the appended claims, along with the full scope of equivalents to which such claims are entitled.

What is claimed is:

1. A processor comprising:
    a first memory interface including at least a first channel and a second channel to be coupled to a plurality of dual in-line memory module (DIMM) sockets located off-package of the processor;
    a second memory interface to be coupled to a non-volatile memory (NVM) socket located off-package of the processor;
    a multi-level memory controller (MLMC) coupled to the first memory interface and to the second memory interface, wherein the MLMC comprises a first configuration and a second configuration, and the MLMC is to:
        detect dynamic random access memory (DRAM)-based DIMMs disposed in at least some DIMM sockets of the plurality of DIMM sockets in a one-level memory (1LM) architecture in the first configuration;
        control the DRAM-based DIMMs in the plurality-of DIMM sockets as main memory in the first configuration;
        detect a switch from a 1LM mode of operation to a two-level memory (2LM) mode of operation in response to a basic input/output system (BIOS) detecting at least one low-power DRAM-based DIMM disposed in one of the plurality of DIMM sockets and a NVM device disposed in the NVM socket in a 2LM architecture in the second configuration; and
        control the at least one low-power DRAM-based DIMM as cache in the second configuration in response to detecting the switch from the 1LM mode of operation to the 2LM mode of operation.

2. The processor of claim 1, wherein the MLMC includes a multiplexer to select between controlling the DRAM-based DIMMs, the at least one low-power DRAM-based DIMM and the NVM device according to the first configuration or the second configuration in response to receipt of an indicator that specifies the first configuration or the second configuration, and wherein the MLMC further comprises:
    a 2LM cache controller;
    a near memory (NM) controller coupled to the first memory interface;
    a far memory (FM) controller coupled to the second memory interface and the 2LM cache controller;
    a system agent arbiter coupled to a requesting unit and the 2LM cache controller; and
    wherein the multiplexer comprises a first input coupled to an output of the 2LM cache controller, a second input coupled to an output of the system agent arbiter, and an output coupled to the NM controller, wherein the multiplexer is to select between the first input and the second input according to the indicator.

3. The processor of claim 1, wherein the first memory interface is a double data rate (DDR) memory interface.

4. The processor of claim 1, wherein the second memory interface is an expansion card interface.

5. The processor of claim 1, wherein the second memory interface is at least one of a M.2 standard interface.

6. The processor of claim 1, wherein the DRAM on the DRAM-based DIMMs comprises double data rate (DDR) DRAM.

7. The processor of claim 6, wherein the DDR DRAM is at least one of DDR3 DRAM, DDR3L or DDR4 DRAM in the first configuration and is low power DDR4 (LPDDR4) DRAM in the second configuration.

8. The processor of claim 1, wherein the at least one low-power DRAM-based DIMM is disposed in one of the plurality of DIMM sockets of the first channel and of the second channel.

9. The processor of claim 1, wherein, in the second configuration, the MLMC is to interact with the at least one low-power DRAM-based DIMM as near memory in the 2LM architecture and with the NVM device as far memory in the 2LM architecture.

10. A system on chip (SoC) comprising:
a plurality of functional units; and
a multi-level memory controller (MLMC) to provide a common platform for a one-level memory (1LM) configuration and a two-level memory (2LM) configuration, wherein the MLMC comprises:
a 2LM cache controller;
a near memory (NM) controller coupled to a first memory interface including at least a first channel and a second channel to communicate with a plurality of dual in-line memory module (DIMM) sockets located off-package of the SoC;
a far memory (FM) controller coupled to a second memory interface and the 2LM cache controller, the second memory interface to communicate with a non-volatile memory (NVM) socket located off-package of the SoC; and
a system agent arbiter coupled to the plurality of functional units and the 2LM cache controller;
wherein the MLMC is to:
detect dynamic random access memory (DRAM)-based DIMMs disposed in at least some DIMM sockets of the plurality of DIMM sockets in the 1LM configuration;
control the DRAM-based DIMMs in the plurality of DIMM sockets as main memory in the 1LM configuration;
detect a switch from a 1LM mode of operation to a 2LM mode of operation in response to a basic input/output system (BIOS) detecting at least one low-power DRAM-based DIMM disposed in one of the plurality of DIMM sockets and a NVM device disposed in the NVM socket in the 2LM configuration; and
control the at least one low-power DRAM-based DIMM as cache in the 2LM configuration in response to detecting the switch from the 1LM mode of operation to the 2LM mode of operation.

11. The SoC of claim 10, wherein the first memory interface is a double data rate (DDR) memory interface and the second memory interface is an expansion card interface.

12. The SoC of claim 11, wherein the DDR memory interface is to interact with at least one of DDR3 dynamic random access memory (DRAM), DDR3L or DDR4 DRAM in the 1LM configuration and low power DDR4 (LPDDR4) DRAM in the 2LM configuration.

13. The SoC of claim 10, wherein the MLMC further comprises a multiplexer comprising a first input coupled to an output of the 2LM cache controller, a second input coupled to an output of the system agent arbiter, and an output coupled to the NM controller, wherein the multiplexer is to select between the first input and the second input based on an indicator that specifies the 1LM configuration or the 2LM configuration.

14. The SoC of claim 10, wherein the at least one low-power DRAM-based DIMM is disposed in one of the plurality of DIMM sockets of the first channel and of the second channel.

15. A method comprising:
determining, by a processor, whether a second memory device is available in a computer platform comprising the processor and a first memory device, the first memory device including a plurality of dynamic random access memory (DRAM)-based dual in-line memory modules (DIMMs), wherein the second memory device is a non-volatile memory device; and
when the second memory device is not available:
presenting to software, by a multi-level memory controller (MLMC) of the processor, a first addressable memory space of system memory based on a first capacity of the first memory device present in the computer platform in a one-level memory (1LM) configuration mode; and
controlling, by the MLMC, the plurality of DRAM-based DIMMs as main memory in the 1LM configuration mode; and
when the second memory device is available:
detecting a switch, by the processor, from the 1LM configuration mode to a two-level memory (2LM) configuration mode due to availability of the second memory device and of at least one low-power DRAM-based DIMM as one of the plurality of DRAM-based DIMMS of the first memory device; and
responsive to detecting the switch from the 1LM configuration mode to the 2LM configuration mode, the MLMC:
setting the first memory device as near memory (NM);
setting at least a portion of the second memory device as far memory (FM);
presenting, to the software, a second addressable memory space of system memory based on a size of the first memory device and the at least a portion of the second memory device; and
controlling the at least one low-power DRAM-based DIMM as cache.

16. The method of claim 15, further comprising:
determining whether the 2LM configuration mode is enabled; and
when the 2LM configuration mode is not enabled, presenting to the software, by the MLMC, the first addressable memory space of system memory based on the first capacity of the first memory device in the 1LM configuration mode; and
when the 2LM configuration mode is enabled, performing the setting the first memory device as the near memory, the setting at least the portion of the second memory as the far memory and presenting to the software the second addressable memory space.

17. The method of claim 15, further comprising:
when the second memory device is present,
   determining, by the processor, a second capacity of the first memory device present; and
   determining, by the processor, a configuration of the first memory device.

18. The method of claim 17, wherein the determining the second capacity comprises reading a DDR capacity of the first memory device and setting a size of the NM for a 2LM controller of the MLMC.

19. The method of claim 15, further comprising:
receiving a memory request for a memory page at a system agent arbiter of the MLMC;
when in the 1LM configuration, sending the memory request to a first memory controller of the MLMC, the first memory controller coupled to the first memory device;
when in the 2LM configuration,
   sending the memory request to a 2LM cache controller of the MLMC; and
   determining, by the 2LM controller, whether an address of the memory request is located in NM, wherein the memory request is sent to the first memory controller when the address is in the NM and the memory request is sent to a FM controller when the address is not in the NM, the FM controller coupled to the second memory device.

20. The method of claim 19, further comprising allocating the memory page in NM when the address is not in the NM.

21. A computer platform comprising:
a central processing unit (CPU) die and package; and
a circuit board comprising a CPU socket in which the CPU die and package is connected, a plurality of dual in-line memory module (DIMM) sockets in which a plurality of dynamic random access memory (DRAM)-based DIMMs are connectable to the CPU die and package, and a non-volatile memory (NVM) socket in which a NVM device is connectable to the CPU die and package, wherein the CPU die and package comprises:
a processor;
a first memory interface coupled to the plurality of DIMM sockets;
a second memory interface coupled to the NVM socket;
a multi-level memory controller (MLMC) coupled to the first memory interface and the second memory interface, wherein the MLMC comprises a one-level memory (1LM) configuration and a two-level memory (2LM) configuration;
wherein the MLMC is to:
   detect the plurality of DRAM-based DIMMs disposed in at least some DIMM sockets of the plurality of DIMM sockets in the 1LM configuration;
   control the plurality of DRAM-based DIMMs as main memory in the 1LM configuration;
   detect a switch from a 1LM mode of operation to a 2LM mode of operation in response to a basic input/output system (BIOS) detecting at least one low-power DRAM-based DIMM disposed in one of the plurality of DIMM sockets and a NVM memory device disposed in the NVM socket in the 2LM configuration; and
   control the at least one low-power DRAM-based DIMM as cache in the 2LM configuration responsive to detecting the switch from the 1LM mode of operation to the 2LM mode of operation; and
wherein the MLMC includes a multiplexer to select between the MLMC controlling the plurality of DRAM-based DIMMs according to the 1LM configuration in the 1LM mode of operation or controlling the at least one low-power DRAM-based DIMM and the NVM device according the 2LM configuration in the 2LM mode of operation, in response to receipt of an indicator that specifies the 1LM configuration or the 2LM configuration, respectively.

22. The computer platform of claim 21, wherein the plurality of DRAM-based DIMMS are at least one of double data rate 3 (DDR3) dynamic random access memory (DRAM) or DDR4 DRAM in the 1LM configuration and the at least one lower-power DRAM-based DIMM is low power DDR4 (LPDDR) in the 2LM configuration.

23. The computer platform of claim 21, wherein the NVM socket is an expansion card socket.

24. The computer platform of claim 23, wherein the plurality of DRAM-based DIMMS are at least one of a small outline DIMM (SoDIMM) or an unbuffered DIMM (UDIMM).

25. The computer platform of claim 21, wherein the MLMC is to interact with the at least one low-power DRAM-based DIMM as near memory in the 2LM configuration and with the NVM device as far memory in the 2LM configuration, and wherein the MLMC comprises:
a 2LM cache controller;
a near memory (NM) controller coupled to the first memory interface;
a far memory (FM) controller coupled to the second memory interface and the 2LM cache controller;
a system agent arbiter coupled to a requesting unit and the 2LM cache controller; and
wherein the multiplexer comprises a first input coupled to an output of the 2LM cache controller, a second input coupled to an output of the system agent arbiter, and an output coupled to the NM controller, wherein the multiplexer is to select between the first input and the second input according to the indicator.

* * * * *